US011653555B2

United States Patent
Roqan et al.

(10) Patent No.: US 11,653,555 B2
(45) Date of Patent: May 16, 2023

(54) METHODS AND APPARATUSES FOR FABRICATING PEROVSKITE-BASED DEVICES ON COST-EFFECTIVE FLEXIBLE CONDUCTIVE SUBSTRATES

(71) Applicant: KING ABDULLAH UNIVERSITY OF SCIENCE AND TECHNOLOGY, Thuwal (SA)

(72) Inventors: Iman Salem Roqan, Thuwal (SA); Norah Mohammed Alwadai, Thuwal (SA); Somak Mitra, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 16/638,359

(22) PCT Filed: Aug. 17, 2018

(86) PCT No.: PCT/IB2018/056240
§ 371 (c)(1),
(2) Date: Feb. 11, 2020

(87) PCT Pub. No.: WO2019/043495
PCT Pub. Date: Mar. 7, 2019

(65) Prior Publication Data
US 2020/0168822 A1    May 28, 2020

Related U.S. Application Data

(60) Provisional application No. 62/585,174, filed on Nov. 13, 2017, provisional application No. 62/553,480, filed on Sep. 1, 2017.

(51) Int. Cl.
*H01L 51/42* (2006.01)
*H01L 31/0392* (2006.01)
*H01L 51/00* (2006.01)

(52) U.S. Cl.
CPC .... *H01L 51/0097* (2013.01); *H01L 31/03926* (2013.01); *H01L 51/0002* (2013.01); *H01L 51/4233* (2013.01)

(58) Field of Classification Search
CPC ............. H01L 51/0097; H01L 51/0002; H01L 51/4233; H01L 31/03926
See application file for complete search history.

(56) References Cited

U.S. PATENT DOCUMENTS

| | | | |
|---|---|---|---|
| 2015/0144195 A1* | 5/2015 | Irwin | H01L 51/4253 136/260 |
| 2015/0249170 A1* | 9/2015 | Snaith | H01L 31/1884 136/256 |

(Continued)

FOREIGN PATENT DOCUMENTS

| | | |
|---|---|---|
| EP | 3273497 A1 | 1/2018 |
| WO | 2016152766 A1 | 9/2016 |

OTHER PUBLICATIONS

Sarip et al., Synthesis and Characterization of Gaolinium Doped Zinc Oxide Nanorods Thin Films, Apllied Mechanics and Materials, vol. 773-774, pp. 734-738 (Year: 2015).*

(Continued)

*Primary Examiner* — Jayne L Mershon
(74) *Attorney, Agent, or Firm* — Patent Portfolio Builders PLLC

(57) ABSTRACT

Provided are methods, systems, and apparatuses providing flexible conductive substrates for nanomaterial/perovskite-based optoelectronic devices. One such apparatus may include a flexible conductive substrate, a nanomaterial layer disposed on the flexible conductive substrate, and a perovskite layer disposed on the nanomaterial layer. The flexible conductive substrate may be a cost-effective metal sheet such as a stainless steel sheet or an aluminum sheet. The nanomaterial layer may comprise semiconductor or oxide (Continued)

nanorods, nanowires, nanotubes, or nanoparticles, such as gadolinium-doped zinc oxide nanorods. The perovskite layer may comprise inorganic or organic perovskite. The apparatus may further include an optically transparent conductive layer disposed on the perovskite layer. Optionally, the apparatus may include an electrical contact disposed on a portion of the optically transparent conductive layer.

20 Claims, 21 Drawing Sheets

(56) References Cited

U.S. PATENT DOCUMENTS

| | | | |
|---|---|---|---|
| 2016/0233439 A1* | 8/2016 | Burschka | H01L 51/0032 |
| 2017/0338045 A1* | 11/2017 | Vak | H01L 27/302 |
| 2018/0033984 A1* | 2/2018 | Luchinger | H01L 51/0007 |
| 2018/0040840 A1 | 2/2018 | Hayakawa et al. | |

OTHER PUBLICATIONS

He, S. et al., "Radically Grown Obelistk-like ZnO Arrays for Perovskite Solar Cell Fibers and Fabrics Through a Mild Solution Process," Journal of Materials Chemistry A, Mar. 30, 2015, vol. 3, pp. 9406-0410, The Royal Society of Chemistry.

International Search Report in corresponding/related International Application No. PCT/IB2018/056240, dated Oct. 2018.

Son, D.-Y. et al., "11% Efficient Perovskite Solar Cell Based on ZnO Nanorods: An Effective Charge Collection System," Journal of Physical Chemistry C, Mar. 7, 2014, vol. 118, No. 30, American Chemical Society.

Written Opinion of the International Searching Authority in corresponding/related International Application No. PCT/IB2018/056240, dated Oct. 29, 2018.

Xiao, Y. et al., "An Efficient Titanium Foil Based Perovskite Solar Cell: Using Titanium Dioxide Nanowire Array Anode and Transparent Poly(3,4-ethylenedioxythiophene) Electrode," RCS Advances, 2016, vol. 6, Issue 4, pp. 2778-2784, The Royal Society of Chemistry.

Batmunkh, M., et al., "Single-Walled Carbon Nanotubes Enhance the Efficiency and Stability of Mesoscopic Perovskite Solar Cells," Applied Materials & Interfaces, May 24, 2017, vol. 9, No. 23, pp. 19945-19954, ACS Publications.

Communication pursuant to Article 94(3) EPC in corresponding/related European Application No. 18762634.6, dated Mar. 14, 2022.

Han, G.S., et al., "Reduced Graphene Oxide/Mesoporous $TiO_2$ Nanocomposite Based Perovskite Solar Cells," Applied Materials & Interfaces, Oct. 28, 2015, vol. 7, No. 42, pp. 23521-23526, ACS Publications.

Nyankson, E., et al., "Nanostructured $TiO_2$ and Their Energy Applications—A Review," ARPN Journal of Engineering and Applied Sciences, Oct. 2013, vol. 8, No. 10, pp. 871-886, Asian Research Publishing Network (ARPN).

Wang, J. T.-W., et al., "Low-Temperature Processed Electron Collection Layers of Graphene/$TiO_2$ Nanocomposites in Thin Film Perovskite Solar Cells," Nano Letters, Dec. 16, 2013, vol. 14, No. 2, pp. 724-730, ACS Publications.

Yang, K., et al., "All-Solution Processed Semi-Transparent Perovskite Solar Cells with Silver Nanowires Electrode," Nanotechnology, Jan. 2016, vol. 27, No. 9, 095202 pp. 1-6, IOP Publishing.

You, P., et al., "Efficient Semitransparent Perovskite Solar Cells with Graphene Electrodes," Advanced Materials, May 12, 2015, vol. 27, No. 24, pp. 3632-3638, WILEY-VCH Verlag GmbH & Co KGaA, Weinheim.

* cited by examiner

METHODS AND APPARATUSES FOR FABRICATING PEROVSKITE-BASED DEVICES ON COST-EFFECTIVE FLEXIBLE CONDUCTIVE SUBSTRATES

CROSS-REFERENCE TO RELATED APPLICATIONS

This application is a U.S. National Stage Application of International Application No. PCT/IB2018/056240, filed on Aug. 17, 2018, which claims priority to U.S. Provisional Patent Application No. 62/553,480, filed Sep. 1, 2017, entitled "METHOD AND APPARATUS FOR FABRICATION OF RARE EARTH DOPED ZNO NO/PEROVSKITE SOLAR CELLS ON FLEXIBLE SUBSTRATES," and U.S. Provisional Patent Application No. 62/585,174, filed Nov. 13, 2017, entitled "METHODS AND APPARATUSES FOR FABRICATING PEROVSKITE-BASED DEVICES ON COST-EFFECTIVE FLEXIBLE CONDUCTIVE SUBSTRATES," the disclosure of these applications being expressly incorporated herein by reference.

BACKGROUND

Perovskite-based structures provide multi-purpose technologies that are useful for performing a wide variety of tasks. For example, these structures may be used in various optoelectronic devices such as solar cells, photodetectors, and light emitting diodes (LEDs). Typically, perovskite-based structures are fabricated on non-flexible transparent substrates and have complex designs, such as an indium tin oxide (ITO) layer between a glass substrate and a layer of nanostructured material, such as zinc oxide (ZnO) nanorods (NRs).

Applicants have identified a number of deficiencies and problems associated with the foregoing. Through applied effort, ingenuity, and innovation, many of these identified problems have been solved by developing solutions that are included in embodiments of the present disclosure, many examples of which are described in detail herein.

SUMMARY

The present disclosure relates to an apparatus that includes a flexible conductive substrate comprising a first surface, a perovskite layer comprising a second surface and a third surface disposed opposite the second surface, and a nanomaterial layer disposed on the first surface of the flexible conductive substrate. The flexible conductive substrate may comprise, for example, a cost-effective (e.g., low cost) metal sheet such as a stainless steel sheet or an aluminum sheet. The nanomaterial layer may comprise, for example, semiconductor or oxide nanorods, nanowires, nanotubes, or nanoparticles. In some example embodiments, the nanomaterial layer may include one or more gadolinium-doped zinc oxide nanorods (Gd-doped ZnO NRs). The nanomaterial layer may be further disposed between the first surface of the flexible conductive substrate and the second surface of the perovskite layer. The apparatus may further include an optically transparent conductive layer comprising a fourth surface disposed on the third surface of the perovskite layer. Optionally, the optically transparent conductive layer may comprise a fifth surface disposed opposite the fourth surface, and the apparatus may include an electrical contact comprising a sixth surface, wherein the sixth surface of the electrical contact is disposed on a portion of a fifth surface of the optically transparent conductive layer.

The present disclosure further relates to a method of manufacturing an apparatus of this nature. The method may include providing a flexible conductive substrate, forming a nanomaterial layer on a surface of the flexible conductive substrate, forming a perovskite layer on a surface of the nanomaterial layer, forming an optically transparent conductive layer on a surface of the perovskite layer, and forming an electrical contact on a portion of a surface of the optically transparent conductive layer. The present disclosure further relates to an apparatus comprising a photodetector device manufactured according to this method. The present disclosure further relates to an apparatus comprising a photovoltaic device manufactured according to this method. The present disclosure further relates to an apparatus comprising a light emitting device manufactured according to this method. The present disclosure further relates to an apparatus comprising a sensing device manufactured according to this method. The present disclosure further relates to a system comprising two or more of a photodetector device, a photovoltaic device, a light emitting device, and a sensing device, wherein one or more of the photodetector device, the photovoltaic device, the light emitting device, and the sensing device were manufactured according to this method.

The above summary is provided merely for purposes of summarizing some example embodiments illustrating some aspects of the present disclosure. Accordingly, it will be appreciated that the above-described embodiments are merely examples and should not be construed to narrow the scope of the disclosure in any way. It will be appreciated that the scope of the disclosure encompasses many potential embodiments in addition to those herein summarized, some of which will be further described below.

BRIEF DESCRIPTION OF THE FIGURES

The accompanying figures illustrate embodiments of the disclosure, and, together with the specification, including the general description above and the detailed description which follows, serve to explain the features of the present disclosure.

DETAILED DESCRIPTION

Figure 1:
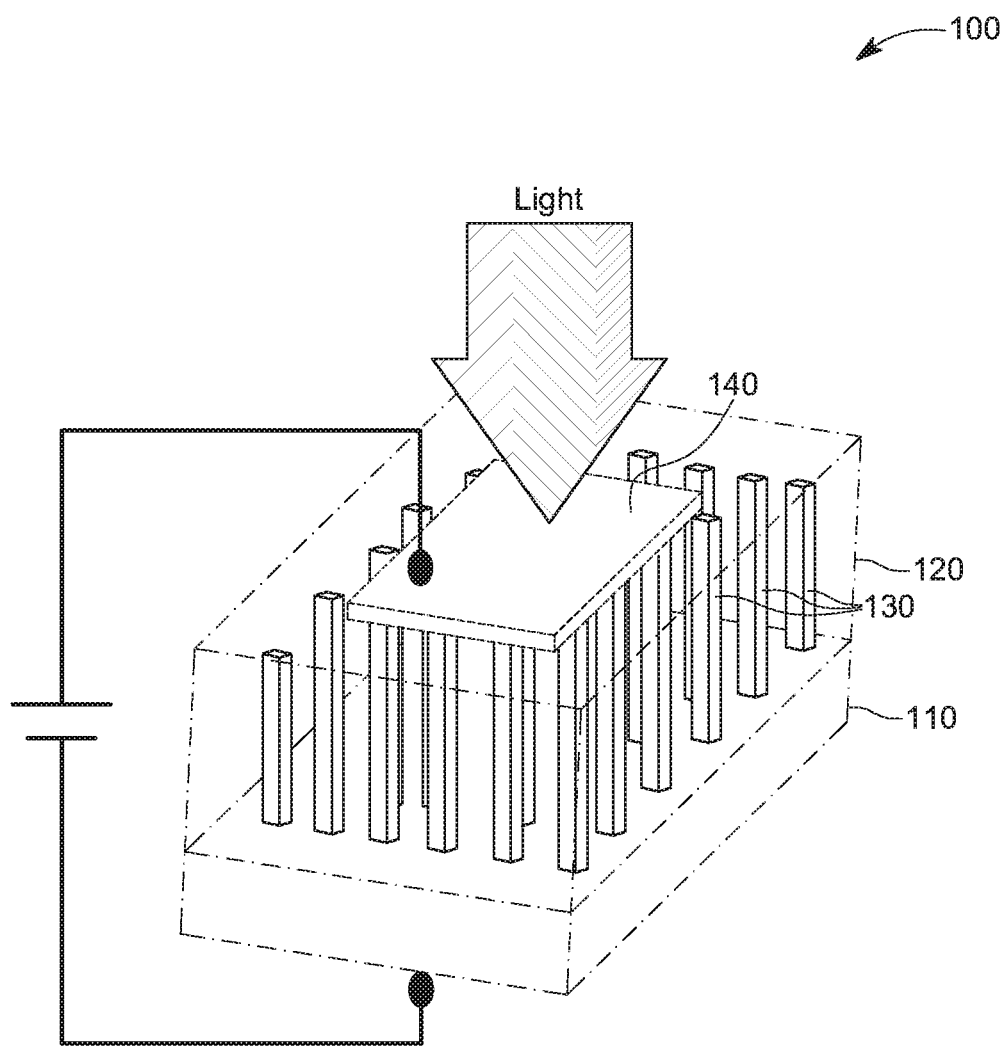
FIG. 1 illustrates a perspective view of an example optoelectronic device according to an example embodiment.

The present disclosure now will be described more fully with reference to the accompanying figures in which some but not all embodiments of the disclosure are shown. Indeed, these embodiments may be embodied in many different forms and should not be construed as limited to the embodiments set forth herein; rather, these embodiments are provided so that this disclosure will satisfy applicable legal requirements. Like numbers refer to like elements throughout. As used herein, terms such as "front," "rear," "top," "bottom," "outside," "inside," "near," "along," "between," "on," "opposite," "facing," and other similar terms are used for explanatory purposes in the examples provided below to describe the relative position of certain devices, structures, layers, or portions thereof. Terminology used in this disclosure is not meant to be limiting insofar as devices, structures, or layers described herein, or portions thereof, may be attached or utilized in other orientations.

The term "comprising" means including but not limited to, and should be interpreted in the manner it is typically used in the patent context. Use of broader terms such as comprises, includes, and having should be understood to provide support for narrower terms such as consisting of, consisting essentially of, and comprised substantially of.

The phrases "in one embodiment," "according to one embodiment," and the like generally mean that the particular feature, structure, or characteristic following the phrase may be included in at least one embodiment of the present disclosure or more than one embodiment of the present disclosure. Such phrases do not necessarily refer to the same embodiment.

The word "example" is used herein to mean "serving as an example, instance, or illustration." Any implementation described herein as "example" is not necessarily to be construed as preferred or advantageous over other implementations.

The terms "about" or "approximately" or the like, when used with a number, may mean that specific number or a range in proximity to that specific number, as understood by persons of skill in the relevant field.

The term "optoelectronic device" is used herein to refer to any one or more of: a photovoltaic device, such as a photodiode, a solar cell, an array of solar cells, or a solar panel; a photodetector device, such as a photodetector, an image sensor, an array of photodetectors, or a photodetector panel; a light emitting device, such as a light emitting diode (LED), an array of LEDs, an LED panel, or an LED display; a sensing device, such as one or more sensors; any other device equipped with at least one of the materials, structures, or layers described herein; any device configured to function as any of the foregoing devices; or any combination thereof. In one example, an optoelectronic device may include one or more solar cells. In another example, an optoelectronic device may be a solar panel. In another example, an optoelectronic device may include one or more highly sensitive photodetectors. In another example, an optoelectronic device may function both a solar cell and a photodetector. In yet another example, an optoelectronic device may include one or more LEDs.

The term "perovskite" is used herein to refer to any inorganic perovskite material, organic perovskite material, perovskite oxide, or other suitable perovskite material. Perovskite may have several structural forms. In some embodiments, perovskite may have the structural form of $CH_3NH_3PbX_3$, where X represents an element such as Cl, Br, I, or any other suitable element or compound. For example, perovskite may have the structural form of $CH_3NH_3PbI_3$.

The term "nanomaterial" is used herein to refer to any nanostructured material, including, but not limited to, semiconductor or oxide nanorods (NRs), nanowires (NWs), nanotubes (NTs), nanoparticles (NPs), nanocrystals (NCs), or any other suitable nanostructured materials. Nanomaterials may have several structural forms.

In some embodiments, the nanomaterials (e.g., semiconductors or oxides) may be doped with impurities, such as aluminum (Al), rare earth elements (e.g., gadolinium (Gd)), or any other suitable element or compound. For example, Gd may be used to increase the performance of an optoelectronic device. Gd dopants increase the donor density of ZnO, as Gd increases the n-type conductivity of ZnO, leading to high electron carrier density and significant mobility and device conductivity compared to other dopants. In some embodiments, the nanomaterials (e.g., semiconductors or oxides) may be undoped. In some embodiments, the term "nanomaterial" may refer to zinc oxide nanorods (ZnO NRs), including, but not limited to, rare earth-doped ZnO NRs, such as gadolinium-doped (Gd-doped) ZnO NRs. In other embodiments, the term "nanomaterial" may refer to zinc oxide nanowires (ZnO NWs), including, but not limited to, rare earth-doped ZnO NWs, such as Gd-doped ZnO NWs. In still other embodiments, the term "nanomaterial" may refer to carbon-based nanomaterials, including, but not limited to, carbon nanotubes (CNTs) and graphene. A nanomaterial may be fabricated, formed, deposited, or grown on a surface of a substrate using any suitable formation, deposition, or growth process or technique, such as pulsed laser deposition, magnetron sputtering, chemical vapor deposition (CVD), metal-organic chemical vapor deposition (MOCVD), plasma-enhanced chemical vapor deposition (PECVD), electrodeposition, molecular beam epitaxy (MBE), any other suitable process, or any combination thereof. In some instances, nanomaterials may form arrays, clusters, or islands of nanomaterials on the surface of the substrate. In some instances, nanomaterials be fabricated, formed, deposited, or grown in the presence of an electric field to improve vertical alignment, uniformity, distribution, yield, any other suitable parameter, or any portion thereof. For example, nanomaterials (e.g., NRs, NWs, NTs) may be fabricated by PECVD in the presence of a self-bias electric field between the substrate and the plasma, which may yield nanomaterials that grow along the direction of the electric field.

The term "layer" is used herein to refer to any element, compound, material, structure, film, thin film, or contact (e.g., electrical contact, patterned electrical contact, top contact, bottom contact, anode, cathode, thermal contact, heat spreader, heat sink) disposed on a substrate, another layer, or any portion thereof. For example, a layer may be deposited or grown on a substrate, a previously deposited or grown layer, or one or more portions thereof using any suitable deposition or growth process or technique, such as sputtering, magnetron sputtering, pulsed laser deposition, chemical vapor deposition, metal-organic chemical vapor deposition, plasma-enhanced chemical vapor deposition, physical vapor deposition, electron beam physical vapor deposition, evaporation, electron beam evaporation, electron beam lithography, atomic layer deposition, electrodeposition, molecular beam epitaxy, vacuum, spin coating, etching, printing, screening, stenciling, patterning, masking, shadow masking, electroplating, electrodeposition, any other suitable deposition or growth process or technique, or any combination thereof.

If the specification states a component or feature "may," "can," "could," "should," "would," "preferably," "possibly," "typically," "optionally," "for example," "often," or "might" (or other such language) be included or have a characteristic, that particular component or feature is not required to be included or to have the characteristic. Such component or feature may be optionally included in some embodiments, or it may be excluded.

The components illustrated in the figures represent components that may be present in various embodiments of the disclosure described herein. In some instances, the components illustrated in the figures represent components that may not be present in various embodiments of the disclosure described herein. Accordingly, some embodiments of the present disclosure may include fewer components, more components, or different combinations of components than those shown in the figures while not departing from the scope of the disclosure.

Overview

In general, embodiments of the present disclosure provide methods, apparatuses and systems related to electronic and optoelectronic devices. More specifically, embodiments of the present disclosure provide simpler and more cost-effective methods for fabricating nanomaterial/perovskite-based devices, such as zinc oxide nanorod/perovskite-based devices, on flexible conductive substrates. For example, these devices may include optoelectronic devices such as photodetector devices, photovoltaic devices, and light emitting devices.

Perovskite materials are important to researchers and practitioners due to its application in photovoltaic and photodetector devices. Typically, perovskite materials have a relatively simple fabrication process and high power conversion efficiency. Accordingly, perovskite usage in optoelectronic devices, such as LEDs, highly sensitive photodetectors, and solar cells, has also become more prevalent, allowing these devices to attain certified power conversion efficiencies above 20 percent.

In addition, nanomaterials (e.g., semiconductor or oxide nanomaterials, such as zinc oxide nanorods, nanowires, or nanotubes) may be utilized to increase the device performance for several reasons. For example, nanomaterials act as effective charge collection layers in perovskite-based solar cell devices. For example, the conversion efficiency of the solar cell devices may increase as NR length increases. Moreover, the seed layer on these transparent oxides is crucial for obtaining vertically-aligned nanomaterials, such as ZnO NRs or NWs. Although undoped nanomaterials are commonly used for such devices, aluminum-doped zinc may be used to increase the donor density. Further, rare earth doped semiconductor or oxide nanomaterials, such as gadolinium (Gd)-doped ZnO NRs, may be used to increase device performance, efficiency, or both.

Typically, nanomaterial/perovskite-based devices are fabricated on non-flexible transparent substrates, such as fluorine doped tin oxide (FTO), and indium tin oxide (ITO), whereby a nanomaterial such as ZnO serves as a seed layer on which the conductive layer (such as a layer that includes Au, Ag or Al) is deposited as a contact on the top of the device. A wide variety of zinc oxide film/perovskite-based devices have been fabricated on ITO, deposited on unconducive flexible glass substrates. For example, a ZnO NR-based structure has been grown on flexible glass characterized by structure of fluorine doped tin oxide (FTO) ($SnO_2$: F)-glass (or PET-ITO followed by ($In_2O_3$ ($SnO_2$) (ITO)) on polyethylene terephthalate (PET)/ZnAc seed layer/ZnO NRs/$CH_3NH_3PbI_3$/Spiro-OMeTAD/Au.

However, none of these devices have been fabricated on an inexpensive flexible conductive substrate that can be easily bent. In addition, because having top contacts on the unconducive flexible glass is important, these devices use ITO or FTO between the glass and the ZnO, resulting in increased complexity of the device design. Additionally, a conventional oxide-perovskite device typically needs a separate cathode layer and an electron transport layer. Further, the conventional semiconductor-organic, semiconductor-perovskite, or oxide-perovskite device usually achieves contact from the top, as glass is used for its fabrication. These devices commonly are fabricated on a rigid glass, a material of relatively high cost characterized by high brittleness and inflexibility, all of which hinder the application and scope of these devices considerably. For example, ZnO nanorods/polymer organic-LEDs have been fabricated on stainless steel foils by metal-organic chemical vapor deposition (MOCVD). However, none of these devices have achieved semiconductor or oxide/perovskite on a flexible conductive substrate (e.g., flexible metal substrate) for LED or solar or photodetector applications.

In some embodiments set forth herein, a low-cost, free-hole conductor perovskite/Gd-doped ZnO NRs heterojunction is fabricated on a flexible conductive substrate for solar cell, photodetector or LED devices. In some embodiments, nanomaterial/perovskite-based devices are fabricated on a metal sheet, such as an aluminum sheet or a 316L stainless steel sheet. Thus, the substrate may be very cost-effective, allowing it to be used for large-sized panels. Physically, chemically, and mechanically, metal sheets like aluminum, steel, brass, copper, lead, or titanium conduct electric current and are lightweight, while providing corrosion resistance as well as electrical and thermal conductivity. In addition, nanomaterials such as semiconductor or oxide nanorods or nanowires (e.g., zinc oxide nanorods) may be grown on the surface of the flexible conductive substrate (e.g., metal substrate) without using a seed layer or a conductive oxide layer. Further, unlike conventional devices, the upper part of the nanomaterial/perovskite-based devices set forth herein is the transparent side of the optoelectronic device.

The embodiments and features of this disclosure allow for fabricating simple and inexpensive lightweight flexible/large scale devices that can achieve a high potential efficiency without the fabrication complexity characterizing existing designs. For example, none of the currently available designs employ Gd dopant. Further, none of the currently available designs is fabricated on a flexible and inexpensive lightweight metal substrate that would serve as the back contact without using seed layer or conductive layer, such as ITO and FTO.

Many benefits and advantages are provided by the present disclosure. For example, as a result of the use of a metal sheet (e.g., an Al or 316L stainless steel sheet) as both substrate and the back contact, there is no need to use a seed layer or conductive oxide to grow the nanomaterials. Rather, the nanomaterials (e.g., semiconductor or oxide NRs or NWs) are grown on the metal substrate, which acts as a catalyst layer for the nanomaterials. This is followed by perovskite deposition (e.g., $CH_3NH_3PbX_3$, where X=Cl, Br, I). In this device, the upper part is the transparent side. ITO is deposited on perovskite, followed by placing Au on the side of the device. In another example, the inexpensive metal substrate, which can be used for large-scale panels, works both as a cathode and an electron transport layer, simplifying the device design. Therefore, there is no need for a separate cathode layer and an electron transport layer. In another example, unlike in conventional devices where the electrical contact is achieved from the top because glass is used for their fabrication, in each of the disclosed devices the electric current can be injected both from the top and from the bottom of the device, because the device is transparent from the top, rather than the bottom. In another example, nanomaterials can be grown on a metal sheet by any technique, as the metal sheet can act as metal catalyst layer. These techniques include, but are not limited to, pulsed laser deposition, magnetron sputtering, MOCVD, electrodeposition, and molecular beam epitaxy.

The embodiments and features of this disclosure further provide for infrared (IR) detection using a nanomaterial/perovskite photodetector (PD). None of the typical PDs based on perovskite have shown infrared (IR) detection (>1000 nm). The present disclosure provides for perovskite-based photodetectors that extend their detection capabilities to IR (>1000 nm) with much higher room temperature responsivity across the detected spectrum compared with currently available commercial devices, leading to an increased performance, cost-effective UV-to-IR broadband photodetector design based on the broad spectral detection due to intra-band transition in IR region. In addition, the perovskite-based photodetector performance is enhanced by using oxide or semiconductor (e.g., Gd-doped ZnO) nanorods or nanowires grown on a cost-effective metal substrate. The metal substrate permits high carrier density, improving significantly the performance of the photodetector. In addition, the metal substrate has a much lower cost, and the flexibility of the metal substrate allows for larger scale production than conventional devices achieved by using conductive glass substrates.

The embodiments and features of this disclosure further provide for enhanced ZnO performance using Gd dopants. Conventional devices do not use rare earth dopants. The present disclosure provides for the use of Gd dopants for enhancing ZnO performance. Gd dopants were found to increase the donor density of ZnO, as Gd increases the n-type conductivity of ZnO, leading to high electron carrier density and significant mobility and device conductivity compared to other dopants. Accordingly, the embodiments and features of this disclosure provide methods and apparatuses for developing high-performance, low cost, and flexible large-scale UV-to-IR broadband photodetectors with high responsivity over the entire light spectrum. The embodiments and features of this disclosure further provide for fabricating simple and inexpensive lightweight flexible/large scale devices that can achieve a potential efficiency without the fabrication complexity characterizing conventional designs. None of the conventional designs employ Gd dopant, and none of the conventional designs are fabricated on flexible and inexpensive lightweight metal substrate that would serve as the back contact without using seed layer or conductive layer, such as ITO and FTO.

The embodiments and features of this disclosure further provide nanomaterial/perovskite-based device architectures incorporating a metal substrate as a back contact. Such metal substrates were found to increase electron harvesting. The embodiments and features of this disclosure further provide for a high-performance vertical type broadband photodetector based on perovskite on nanomaterial (e.g., semiconductor or oxide NRs or NWs, including, but not limited to Gd-doped ZnO NRs), using a metal substrate and an optically transparent conductive material (e.g., ITO) as a top contact or electrode. This perovskite photodetector device may be sensitive to a wide spectral range, spanning from the ultraviolet to the infrared region (>1000 nm) with high photo-responsivity comparable to conventional IR detectors. This perovskite photodetector device may have high photo-responsivity and high detectivity in both white light and infrared spectral regions. In some embodiments, indium tin oxide (ITO) may be used as a transparent electrode due to its environmental stability, high electrical conductivity and high transparency over a broad range of wavelengths. In devices that use Gd-doped ZnO as the electron transport layer (ETL), the Gd dopants significantly enhance ZnO mobility and conductivity.

Additional features and embodiments of the present disclosure are described in U.S. Provisional Patent Application No. 62/553,480, filed Sep. 1, 2017, which is incorporated herein in its entirety.

Technical Details

FIG. 1 illustrates a perspective view of an example optoelectronic device 100 according to an example embodiment. In accordance with some example embodiments, optoelectronic device 100 may include various components, structures, and/or layers. For example, optoelectronic device 100 may include flexible conductive substrate 110, perovskite layer 120, nanomaterial layer 130, and optically transparent conductive layer 140. In some embodiments, optoelectronic device 100 may have more or less components, structures, or layers than those shown in FIG. 1 or described with reference thereto.

As shown in FIG. 1, flexible conductive substrate 110 may have a first surface, and perovskite layer 120 may have a second surface and a third surface disposed opposite the second surface. The second surface of perovskite layer 120 may be disposed facing the first surface of flexible conductive substrate 110. Nanomaterial layer 130 may be disposed on the first surface of flexible conductive substrate 110, forming an interface between nanomaterial layer 130 and flexible conductive substrate 110. For example, nanomaterial layer 130 may be deposited or grown on the first surface of flexible conductive substrate 110 using any suitable deposition or growth process (e.g., pulsed laser deposition, magnetron sputtering, metal-organic chemical vapor deposition (MOCVD), electrodeposition, molecular beam epitaxy). In some instances, nanomaterial layer 130 may be further disposed between the first surface of flexible conductive substrate 110 and the second surface of perovskite layer 120. In some embodiments, a first portion of the nanomaterial layer 130 may extend into a second portion of perovskite layer 120. For example, the nanomaterial layer 130 may have an uneven topography, and perovskite layer 120 may be fabricated on top of the nanomaterial layer 130. In another example, nanomaterial layer 130 and perovskite layer 120 may be a composite, intermingled, or otherwise heterogeneous layer or layers. In another example, nanomaterial layer 130 may form clusters or islands of nanomaterials within perovskite layer 120. In another example, perovskite layer 120 that is deposited on nanomaterial layer 130 may be crystallized into a nanoparticle layer, completely filling the gap between nanomaterial arrays.

As further shown in FIG. 1, optically transparent conductive layer 140 may comprise a fourth surface and a fifth surface disposed opposite the fourth surface. The third surface of perovskite layer 120 may be disposed facing the fourth surface of optically transparent conductive layer 140 and, in some instances, may form an interface between perovskite layer 120 and optically transparent conductive layer 140. In some instances, the fourth surface of optically transparent conductive layer 140 may be disposed on the third surface of perovskite layer 120. For example, optically transparent conductive layer 140 may be deposited or grown on the third surface of perovskite layer 120 using any suitable deposition or growth process (e.g., physical vapor deposition, sputtering, electron beam evaporation).

Flexible conductive substrate 110 may be any suitable cost-effective (e.g., low cost) flexible conductive substrate as described herein. The term "flexible conductive substrate" is used herein to refer to any substrate that is cost-effective, physically flexible, and electrically conductive (e.g., metal). The term "electrically conductive" refers to an electrical conductivity of greater than about 10,000 Siemens per centimeter. The term flexible conductive substrate may refer to, for example, a metal sheet comprising aluminum, steel, brass, copper, lead, titanium, or any other element, compound, or alloy that is electrically conductive. Physically, chemically and mechanically, flexible conductive substrates such as metal sheets conduct electric current and are lightweight, while providing corrosion resistance as well as electrical and thermal conductivity. In some instances, a thickness of flexible conductive substrate 110 (e.g., a distance from a point on the first surface of flexible conductive substrate 110 to a point on a surface of flexible conductive substrate 110 opposite the first surface) may be greater than a minimum thickness of about 1,000 nanometers. In some instances, a thickness of flexible conductive substrate 110 may be less than a maximum thickness of about 0.5 millimeters. In some instances, a surface area of the first surface of flexible conductive substrate 110 may be greater than a minimum surface area of about 1 square centimeter. In some instances, a surface area of the first surface of flexible conductive substrate 110 may be greater than a minimum surface area of about 1 square meter. In one example, flexible conductive substrate 110 may be or include a metal sheet such as a 316L stainless steel sheet. In another example, flexible conductive substrate 110 may be or include a metal sheet such as a metal sheet comprising aluminum (e.g., an aluminum sheet).

In some embodiments, optoelectronic device 100 may be used for large-scale panels because flexible conductive substrate 110 is formed using inexpensive Al sheet. In some embodiments, flexible conductive substrate 110 functions both as a cathode and an electron transport layer, simplifying the device design. Therefore, unlike conventional perovskite-based devices, there is reduced or no need for a separate cathode layer and an electron transport layer. In some embodiments, nanomaterial layer 130 (e.g., zinc oxide nanorods) may be grown on the surface of flexible conductive substrate 110 without using a seed layer or a conductive oxide layer because flexible conductive substrate 110 may act as a catalyst layer for nanomaterial layer 130. For example, ZnO NRs can be grown on Al sheet by any technique, as the Al sheet can act as a metal catalyst layer. These techniques include, but are not limited to, pulsed laser deposition, magnetron sputtering, MOCVD, electrodeposition, and molecular beam epitaxy. In some embodiments, flexible conductive substrate 110 may act as a substrate, a catalyst layer for one or more nanomaterial layer 130, an electron transport layer, and a cathode for an optoelectronic device, such as optoelectronic device 100 described with reference to FIG. 1 and optoelectronic device 200 described with reference to FIG. 2. For example, the Al sheet may act as a substrate, a catalyst for Gd-doped zinc oxide nanorods, and a back contact for an optoelectronic device. As a result, there is reduced or no need to use a seed layer or conductive oxide to grow the nanomaterial layer 130.

Perovskite layer 120 may be any suitable structure or layer comprising a perovskite material, such as an inorganic perovskite material, an organic perovskite material, a perovskite oxide, or other suitable perovskite material. Perovskite layer 120 may comprise perovskite having one or more of several structural forms. In some embodiments, perovskite layer 120 may comprise perovskite having the structural form of $CH_3NH_3PbX_3$, where X represents an element such as Cl, Br, I, or any other suitable element or compound. For example, perovskite layer 120 may comprise perovskite having the structural form of $CH_3NH_3PbI_3$. In some instances, a thickness of perovskite layer 120 (e.g., a distance from a point on the second surface of perovskite layer 120 to a point on the third surface of perovskite layer 120) may be greater than a minimum thickness of about 200 nanometers. In some instances, a thickness of perovskite layer 120 may be less than a maximum thickness of about 5 micrometers.

Nanomaterial layer 130 may be, for example, any suitable structure or layer comprising one or more nanomaterials. In some embodiments, the nanomaterial layer 130 may comprise one or more semiconductor nanomaterials, one or more oxide nanomaterials, one or more nanorods, one or more nanowires, one or more nanotubes, one or more nanoparticles, any other suitable nanomaterial, or any combination thereof. For example, the nanomaterial layer 130 may comprise one or more semiconductor nanorods, semiconductor nanowires, semiconductor nanotubes, semiconductor nanoparticles, any other suitable semiconductor nanomaterials, or any combination thereof. In another example, the nanomaterial layer 130 may comprise one or more oxide nanorods, oxide nanowires, oxide nanotubes, oxide nanoparticles, any other suitable oxide nanomaterials, or any combination thereof. In yet another example, the nanomaterial layer 130 may comprise one or more carbon nanorods, carbon nanowires, carbon nanotubes (e.g., single-walled carbon nanotubes, multi-walled carbon nanotubes), carbon nanoparticles, any other suitable carbon nanomaterials, or any combination thereof. In yet another example, the nanomaterial layer 130 may comprise graphene. In some embodiments, the nanomaterial layer 130 may comprise one or more semiconductor or oxide (e.g., zinc oxide) nanorods or nanowires. In some embodiments, the nanomaterial layer 130 may comprise one or zinc oxide nanorods. For example, the nanomaterial layer 130 may comprise one or more rare earth doped zinc oxide nanorods, such as one or more gadolinium doped zinc oxide nanorods. In some embodiments, impurities (e.g., Al or rare earth elements such as Gd) may be used to increase the performance of optoelectronic device 100. For example, the nanomaterial layer 130 may comprise one or more rare earth doped zinc oxide nanorods or nanowires, such as Gd-doped zinc oxide nanorods or nanowires. In some instances, a thickness of nanomaterial layer 130 (e.g., a distance from a point on nanomaterial layer 130 near an interface between nanomaterial layer 130 and flexible conductive substrate 110 to a point on nanomaterial layer 130 near an interface between nanomaterial layer 130 and perovskite layer 120) may be greater than a minimum thickness of about 400 nanometers. In some instances, a length of one or more nanomaterials comprised by nanomaterial layer 130 (e.g., a mean, median, or average length of semiconductor or oxide nanorods or nanowires) may be greater than a minimum length of about 50 nanometers. In some instances, a density of the nanomaterial layer 130 may be greater than a minimum density of about 200 per square micrometer ($\mu m^{-2}$). In some instances, a diameter of one or more nanomaterials comprised by nanomaterial layer 130 (e.g., a mean, median, or average diameter of semiconductor or oxide nanorods or nanowires) may be greater than a minimum diameter of about 50 nanometers. In some instances, a growth rate of nanomaterial layer 130 may be greater than a minimum growth rate of about 0.14 nanometers per second. In some instances, an alignment of one or more nanomaterials (e.g., nanorods, nanowires, or nanotubes) comprised by nanomaterial layer 130 may be greater than a minimum alignment that is considered to be vertically well-aligned by one skilled in the art.

Nanomaterial layer 130 may be deposited or grown on the first surface of the flexible conductive substrate using any suitable deposition or growth process or technique. For example, nanomaterial layer 130 may comprise one or more nanomaterials (e.g., semiconductor or oxide nanorods such as zinc oxide nanorods) formed on the first surface of the flexible conductive substrate 110 by pulsed laser deposition, magnetron sputtering, chemical vapor deposition, metal-organic chemical vapor deposition, plasma-enhanced chemical vapor deposition, electrodeposition, molecular beam epitaxy, any other suitable process, or any combination thereof. In some instances, flexible conductive substrate 110 may act as a catalyst layer for nanomaterial layer 130. Thus, nanomaterial layer 130 may be grown on the first surface of flexible conductive substrate 110 without using a seed layer or a conductive oxide layer. For example, nanomaterial layer 130 may include one or more Gd-doped ZnO NRs grown on the surface of an aluminum sheet or a 316L stainless steel sheet without using a seed layer or a conductive oxide layer. In some instances, nanomaterial layer 130 may comprise nanomaterials that form clusters or islands of nanomaterials on the first surface of flexible conductive substrate 110. In some embodiments, a material such as a polymer (e.g., polymethyl methacrylate (PMMA)) may be deposited on the surface of flexible conductive substrate 110 and patterned (e.g., using one or more photolithographic processes) such that nanomaterial layer 130 may be grown on one or more discrete portions of the first surface of flexible conductive substrate 110.

Optically transparent conductive layer 140 may be any structure or layer that is both electrically conductive and optically transparent or optically semi-transparent. The term "optically transparent conductive layer" is used herein to refer to any structure or layer that is both electrically conductive and optically transparent or optically semi-transparent. The term "optically transparent" refers to an optical transparency of greater than about 75 percent. The term "optically semi-transparent" refers to an optical transparency of greater than about 25 percent and less than about 75 percent. The term optically transparent conductive layer may refer to, for example, a layer comprising indium tin oxide (ITO), one or more nanowires (e.g., one or more silver nanowires), a metal mesh, carbon nanotubes (e.g., single-walled carbon nanotubes, multi-walled carbon nanotubes), graphene, a metal layer (e.g., a layer of gold having a maximum thickness of about 50 nanometers), conductive polymers (e.g., inherently conductive polymers such as polyaniline and poly(3,4-ethylenedioxythiophene) polystyrene sulfonate (PEDOT:PSS)), or any other suitable material that is electrically conductive and optically transparent or optically semi-transparent. In one example, optically transparent conductive layer 140 may be layer comprising indium tin oxide (ITO), one or more nanowires (e.g., one or more silver nanowires), a metal mesh, carbon nanotubes (e.g., single-walled carbon nanotubes, multi-walled carbon nanotubes), graphene, a metal layer (e.g., a layer of gold having a maximum thickness of about 50 nanometers), or any other suitable material that is electrically conductive and optically transparent or optically semi-transparent. In some instances, a thickness of optically transparent conductive layer 140 (e.g., a distance from a point on the fourth surface of optically transparent conductive layer 140 to a point on the fifth surface of optically transparent conductive layer 140) may be greater than a minimum thickness of about 50 nanometers. In some instances, a thickness of optically transparent conductive layer 140 may be less than a maximum thickness of about 0.25 micrometers.

In some embodiments, optoelectronic device 100 is transparent from the top, rather than the bottom. Therefore, unlike conventional perovskite-based devices, the electric current can be injected both from the top and from the bottom. In some embodiments, optically transparent conductive layer 140 may be configured to be an anode. In some embodiments, flexible conductive substrate 110 may be configured to be a cathode. In some embodiments, as shown in FIG. 1, optically transparent conductive layer 140 may be configured to be an anode and flexible conductive substrate 110 may be configured to be a cathode. In some embodiments, optically transparent conductive layer 140 may be deposited on perovskite layer 120, and an electrical contact may be deposited on optically transparent conductive layer 140 (e.g., on the top or side of optoelectronic device 100). For example, ITO may be deposited on perovskite, followed by placing Au on the top or side of the device.

Figure 2A:
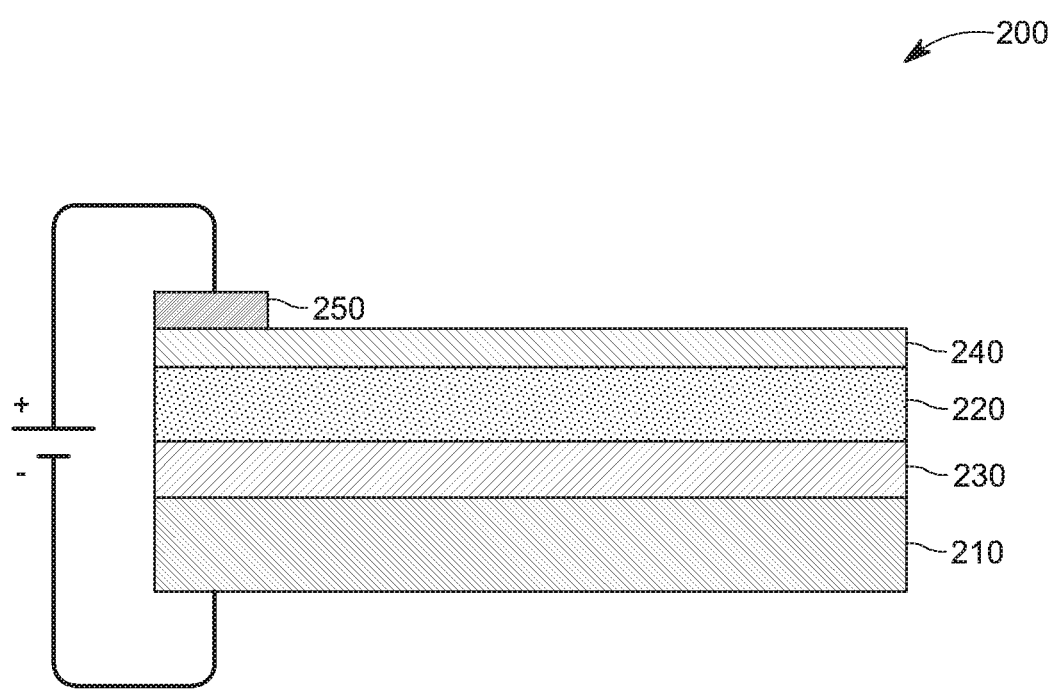
FIGS. 2A and 2B illustrate cross-sectional views of example optoelectronic devices according to example embodiments.
Figure 2B:
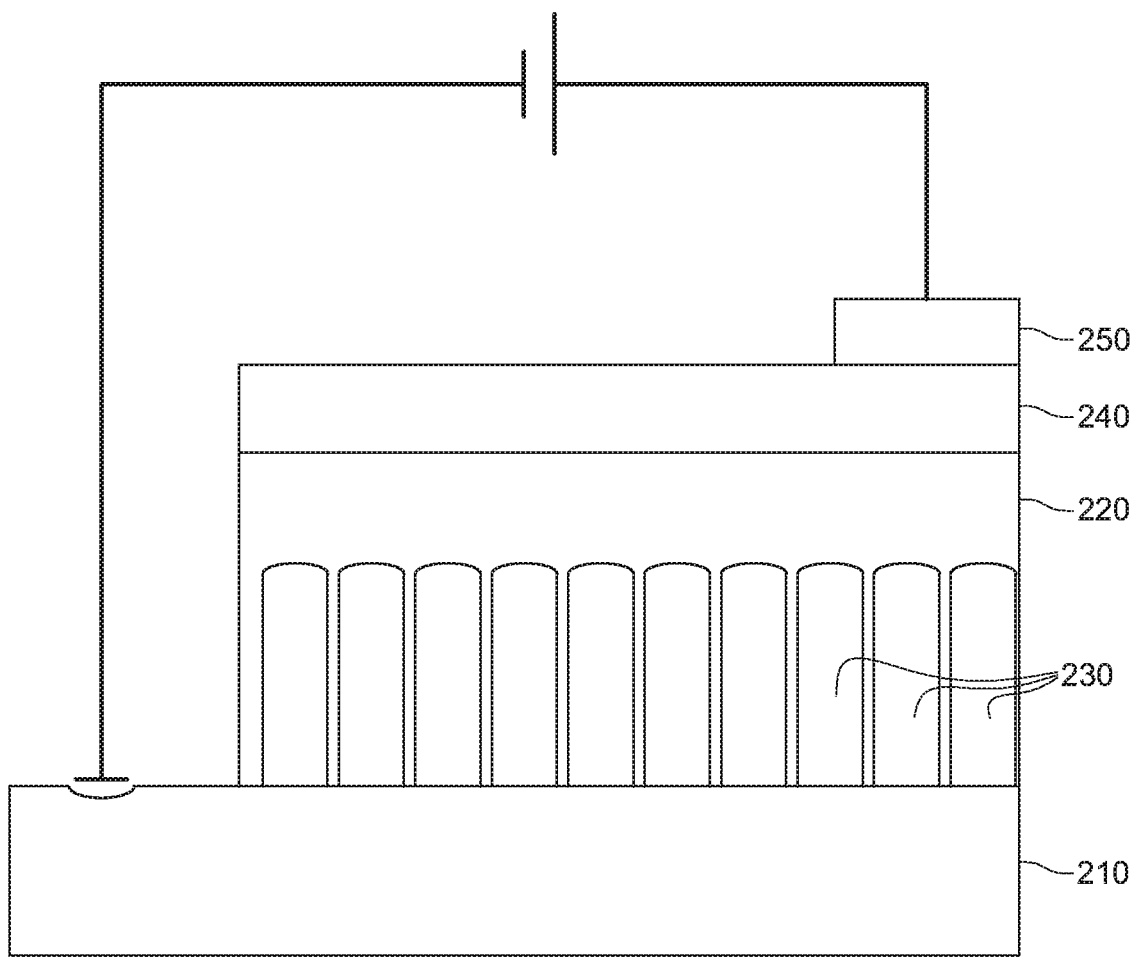

FIGS. 2A and 2B illustrate cross-sectional views of example optoelectronic devices according to example embodiments. FIG. 2A illustrates a cross-sectional view of an example optoelectronic device 200 according to an example embodiment. In accordance with some example embodiments, optoelectronic device 200 may include various components, structures, and/or layers. For example, optoelectronic device 200 may include flexible conductive substrate 210, perovskite layer 220, nanomaterial layer 230, optically transparent conductive layer 240, and optional electrical contact 250. In some embodiments, optoelectronic device 200 may have more or less components, structures, or layers than those shown in FIG. 2A or described with reference thereto.

Flexible conductive substrate 210 may be any suitable flexible conductive substrate described herein, such as flexible conductive substrate 110 described with reference to FIG. 1. Perovskite layer 220 may be any suitable perovskite layer described herein, such as perovskite layer 120 described with reference to FIG. 1. Nanomaterial layer 230 may be any suitable nanomaterial layer described herein, such as nanomaterial layer 130 described with reference to FIG. 1. Optically transparent conductive layer 240 may be any suitable optically transparent conductive layer described herein, such as optically transparent conductive layer 140 described with reference to FIG. 1.

Optional electrical contact 250 may be any suitable contact, structure, or layer that is electrically conductive. The term electrical contact may refer to, for example, a patterned electrical contact, a top contact, or an anode comprising gold, titanium, copper, bismuth, tin, indium, silver, lead, and alloys or layers thereof. In some instances, a thickness of optional electrical contact 250 (e.g., a distance from a point on the sixth surface of optional electrical contact 250 to a point on a surface of optional electrical contact 250 opposite the sixth surface) may be less than a maximum thickness of about 0.05 micrometers. In some instances, optoelectronic device 200 may not include optional electrical contact 250.

As shown in FIG. 2A, flexible conductive substrate 210 may have a first surface, and perovskite layer 220 may have a second surface and a third surface disposed opposite the second surface. The second surface of perovskite layer 220 may be disposed facing the first surface of flexible conductive substrate 210. Nanomaterial layer 230 may be disposed on the first surface of flexible conductive substrate 210, forming an interface between nanomaterial layer 230 and flexible conductive substrate 210. In some instances, nanomaterial layer 230 may be further disposed between the first surface of flexible conductive substrate 210 and the second surface of perovskite layer 220. In addition, optically transparent conductive layer 240 may have a fourth surface and a fifth surface disposed opposite the fourth surface. The third surface of perovskite layer 220 may be disposed facing the fourth surface of optically transparent conductive layer 240 and, in some instances, may form an interface between perovskite layer 220 and optically transparent conductive layer 240. In some instances, the fourth surface of optically transparent conductive layer 240 may be disposed on the third surface of perovskite layer 220. For example, optically transparent conductive layer 240 may be deposited or grown on the third surface of perovskite layer 220 using any suitable deposition or growth process (e.g., physical vapor deposition, sputtering, electron beam evaporation). Further, optional electrical contact 250 may have a sixth surface disposed on a portion of the fifth surface of optically transparent conductive layer 240. The sixth surface of optional electrical contact 250 may be disposed facing the fifth surface of optically transparent conductive layer 240, forming an interface between optional electrical contact 250 and optically transparent conductive layer 240.

In some embodiments, optically transparent conductive layer 240 may be configured to be an anode. In some embodiments, flexible conductive substrate 210 may be configured to be a cathode. In some embodiments, optically transparent conductive layer 240 may be configured to be an anode and flexible conductive substrate 210 may be configured to be a cathode. In some embodiments, optically transparent conductive layer 240 may be deposited on perovskite layer 220, and optional electrical contact 250 may be deposited on optically transparent conductive layer 240 (e.g., on the top or side of optoelectronic device 200). For example, ITO may be deposited on perovskite, followed by placing Au on the top or side of the device.

FIG. 2B illustrates a cross-sectional view of another configuration of example optoelectronic device 200 according to an example embodiment. As shown in FIG. 2B, a first portion of the nanomaterial layer 230 may extend into a second portion of perovskite layer 220. For example, the nanomaterial layer 230 may have an uneven topography, and perovskite layer 220 may be fabricated on top of the nanomaterial layer 230. In another example, nanomaterial layer 230 and perovskite layer 220 may be a composite, intermingled, or otherwise heterogeneous layer or layers. In another example, nanomaterial layer 230 may form clusters or islands of nanomaterials within perovskite layer 220. In another example, perovskite layer 220 that is deposited on nanomaterial layer 230 may be crystallized into a nanoparticle layer, completely filling the gap between nanomaterial arrays.

Technical Implantations

The embodiments and features of the present disclosure may be used to fabricate various devices. For example, the embodiments and features of this disclosure may be used to fabricate inexpensive, flexible, large scale panels of light-emitting diodes, highly sensitive photodetectors, or solar cells using vertical current injection. In another example, the embodiments and features of this disclosure may be used in large-scale photovoltaic devices (e.g., solar panels) or optoelectronic devices (e.g., LED panels, photodetecting devices), because devices fabricated according to the present disclosure may be flexible, cost-effective (e.g., low cost), and high performance.

Figure 3A:
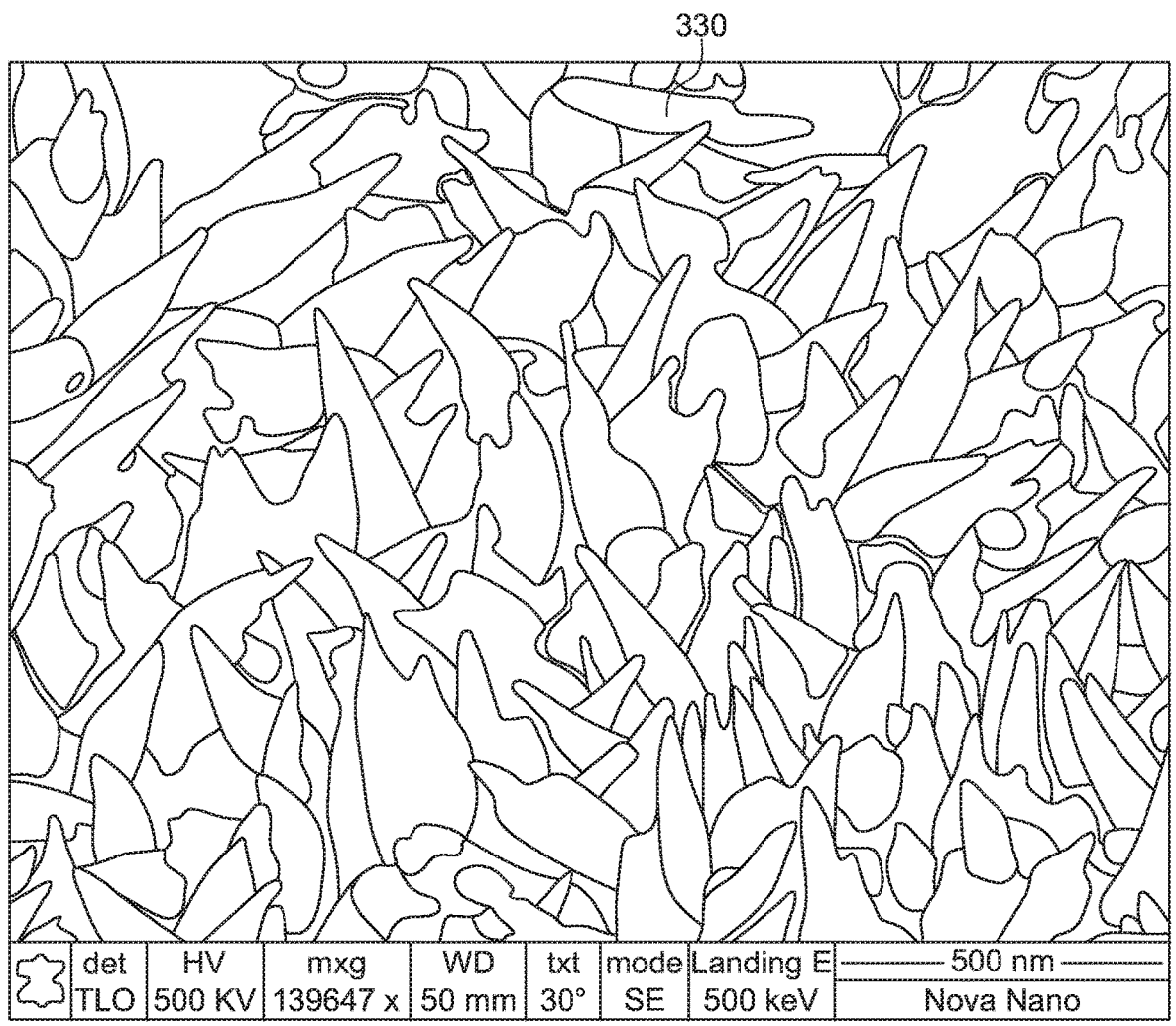
FIGS. 3A, 3B, and 3C illustrate scanning electron microscopy (SEM) images of portions of example optoelectronic devices according to example embodiments.
Figure 3B:
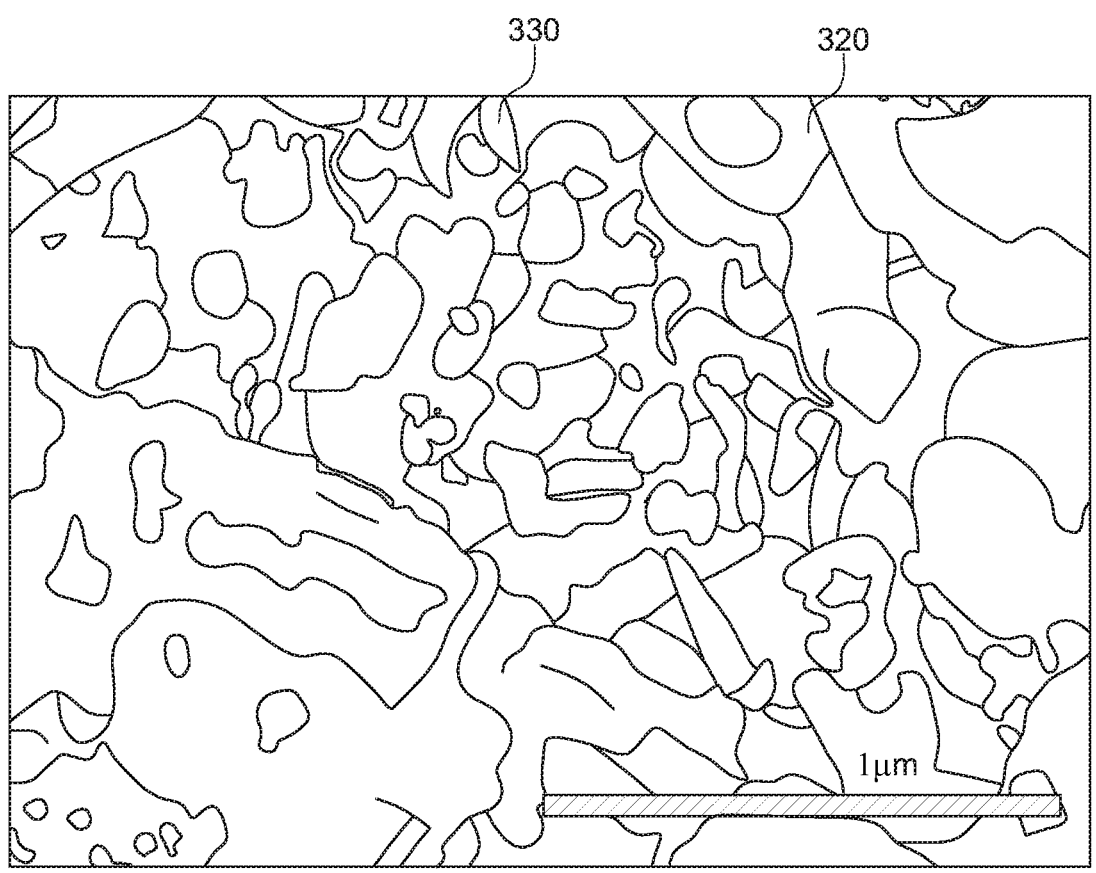
Figure 3C:
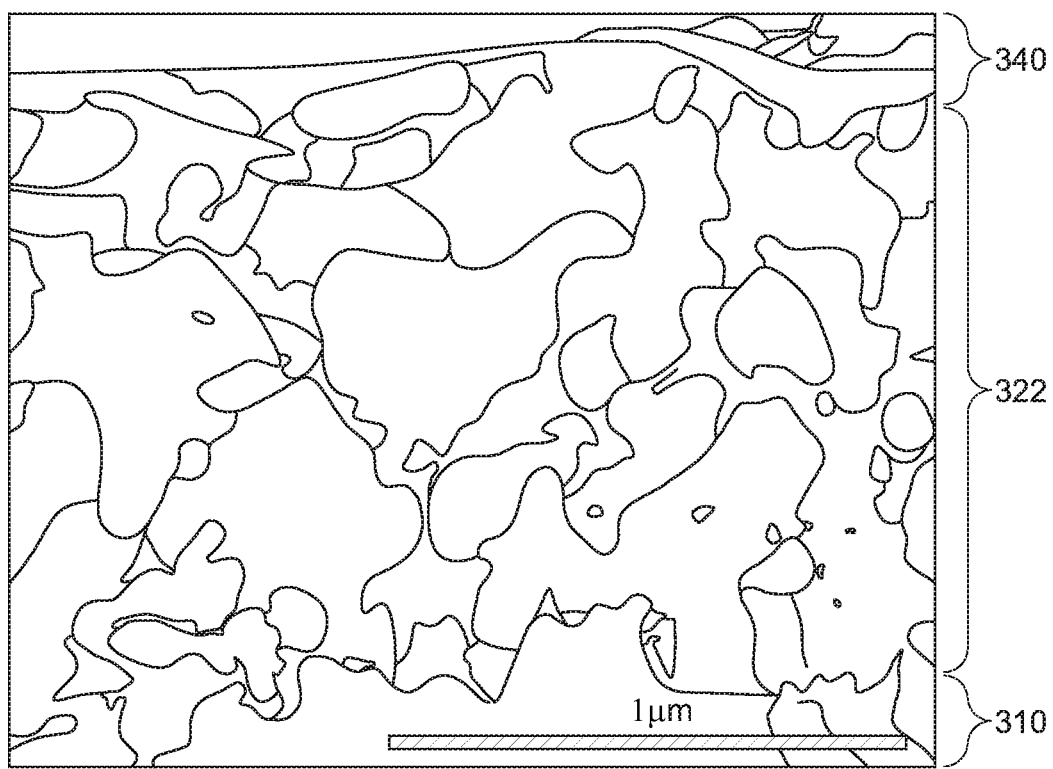

FIGS. 3A, 3B, and 3C illustrate scanning electron microscopy (SEM) images of portions of example optoelectronic devices according to example embodiments. FIG. 3A illustrates an SEM image providing a perspective view of nanomaterial layer 330 according to an example embodiment. Nanomaterial layer 330 comprises Gd-doped zinc oxide nanorods grown on a metal substrate (e.g., Al sheet, 316L stainless steel sheet), which acts as a catalyst layer for the nanorods. FIG. 3A shows that the metal substrate is uniformly and compactly covered by Gd-doped ZnO NR array grown vertically by pulsed laser deposition (PLD) without using a seed layer (NRs having length of around 450 nanometers and diameters of around 60-85 nanometers were obtained).

FIG. 3B illustrates an SEM image providing a perspective view of perovskite layer 320 disposed on nanomaterial layer 330 according to an example embodiment. Perovskite layer 320 comprises $CH_3NH_3PbI_3$ perovskite. Nanomaterial layer 330 comprises Gd-doped ZnO NRs. FIG. 3B shows that the $CH_3NH_3PbI_3$ perovskite deposited on the Gd-doped ZnO NRs is crystallized into a nanoparticle layer, completely filling the gap between ZnO NR arrays.

FIG. 3C illustrates an SEM image providing a cross-sectional view of flexible conductive substrate 310, ZnO NR-perovskite layer 322, and optically transparent conductive layer 340. Flexible conductive substrate 310 comprises a 316L stainless steel sheet. ZnO NR-perovskite layer 322 comprises a composite (e.g., heterogeneous) layer of $CH_3NH_3PbI_3$ and Gd-doped ZnO NRs. Optically transparent conductive layer 340 comprises a layer of ITO. Accordingly, FIG. 3C shows a cross-sectional SEM image of Gd-doped ZnO NRs, $CH_3NH_3PbI_3$ perovskite, and ITO fabricated on 316L stainless steel.

Figure 4:
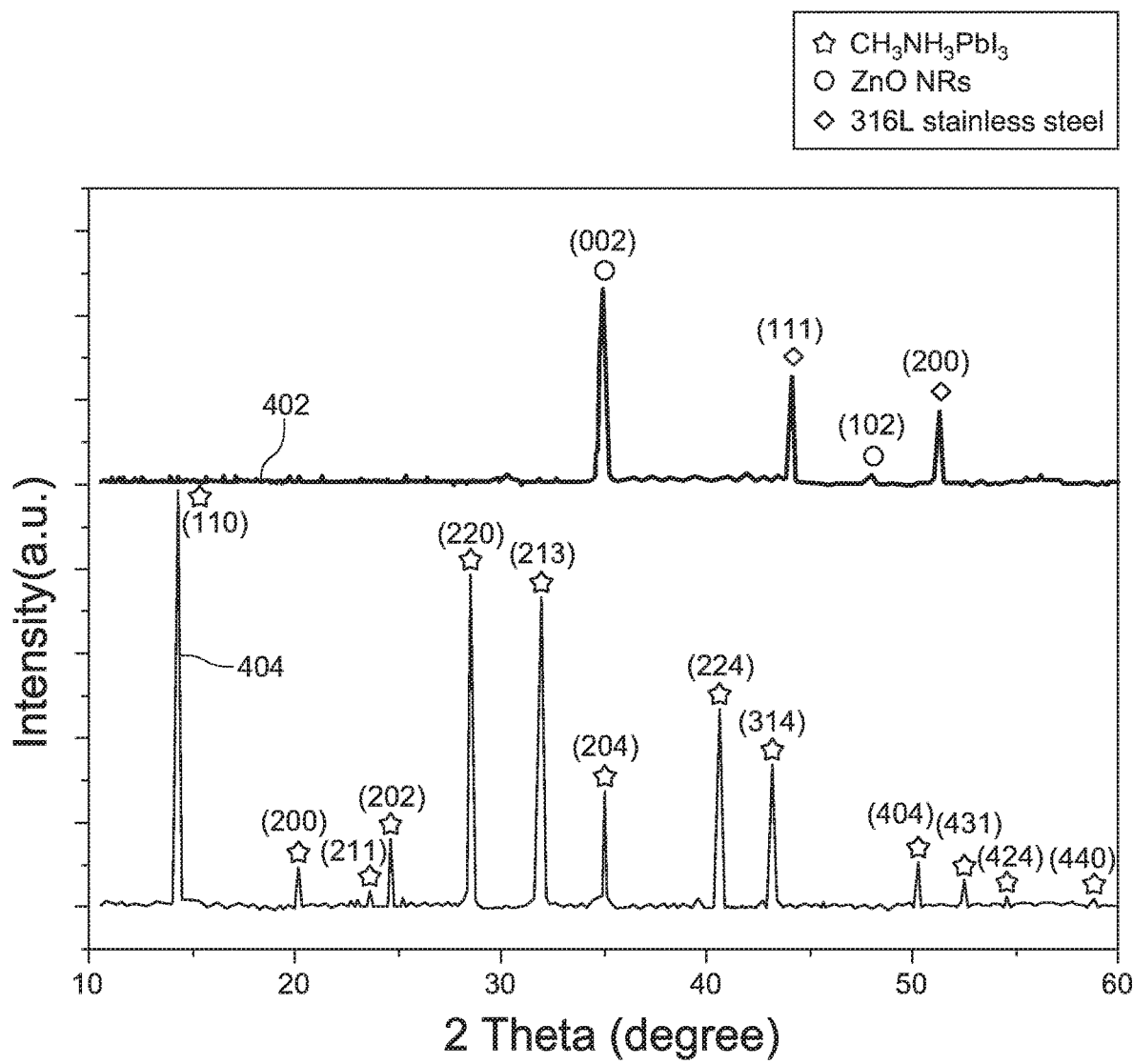
FIG. 4 illustrates x-ray diffraction (XRD) measurements for various components of an example optoelectronic device according to an example embodiment.

FIG. 4 illustrates x-ray diffraction (XRD) measurements for various components of an example optoelectronic device according to an example embodiment. As shown in FIG. 4, curve 402 provides an XRD pattern for Gd-doped ZnO NRs (without perovskite) grown on 316L stainless steel substrate, and curve 404 provides an XRD pattern for ZnO NRs/$CH_3NH_3PbI_3$ grown on 316L Stainless Steel substrate. Curve 402 shows a dominant ZnO peak at 34.47 degrees, along with a weak peak at 47.51 degrees, which are assigned to the (002) and (102) planes of ZnO, respectively, confirming the hexagonal structure and a preferred (002) orientation. Curve 404 shows a series of diffraction peaks arising from the ZnO NRs/$CH_3NH_3PbI_3$ perovskite corresponding to a typical XRD pattern of $CH_3NH_3PbI_3$ perovskite, which are in good agreement with conventional values.

Figure 5A:
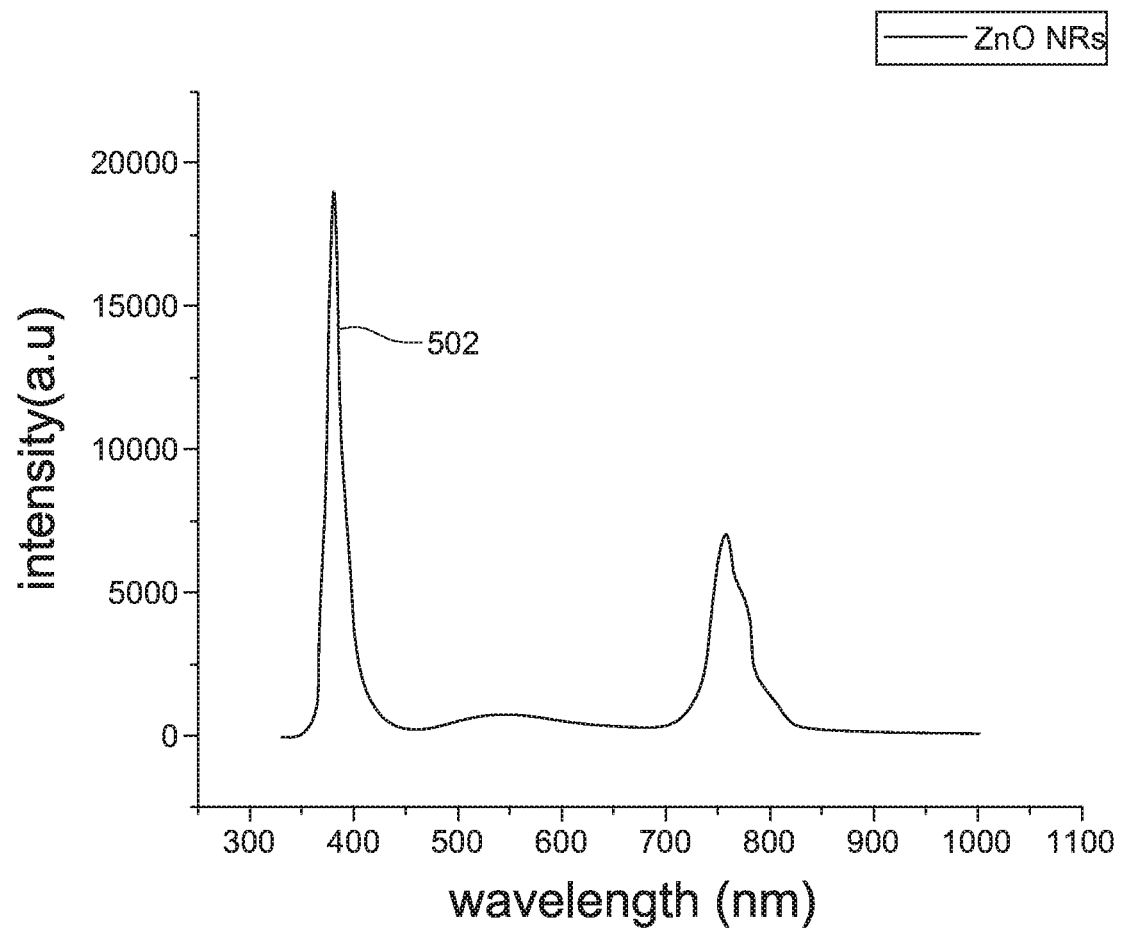
FIGS. 5A, 5B, and 5C illustrate ultraviolet-visible (UV-Vis) absorption measurements for various components of an example optoelectronic device according to an example embodiment.
Figure 5B:
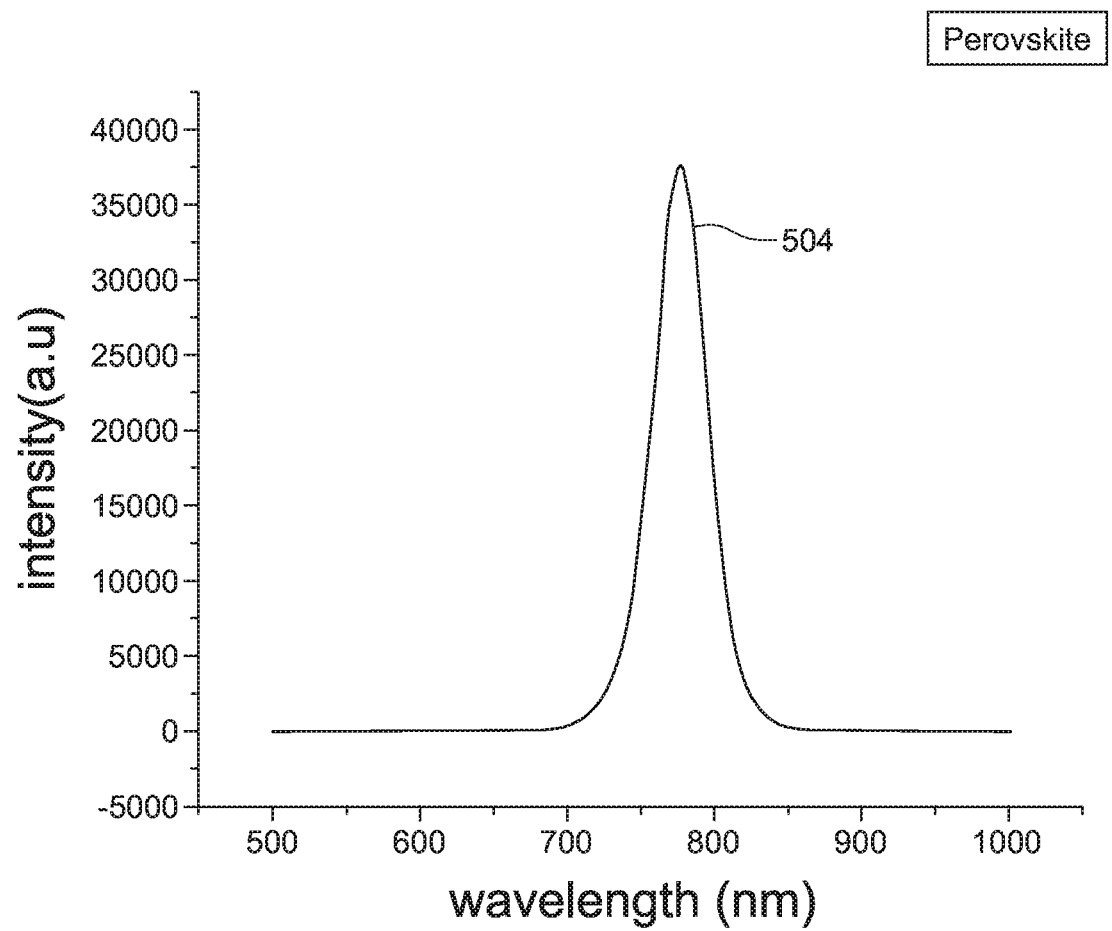
Figure 5C:
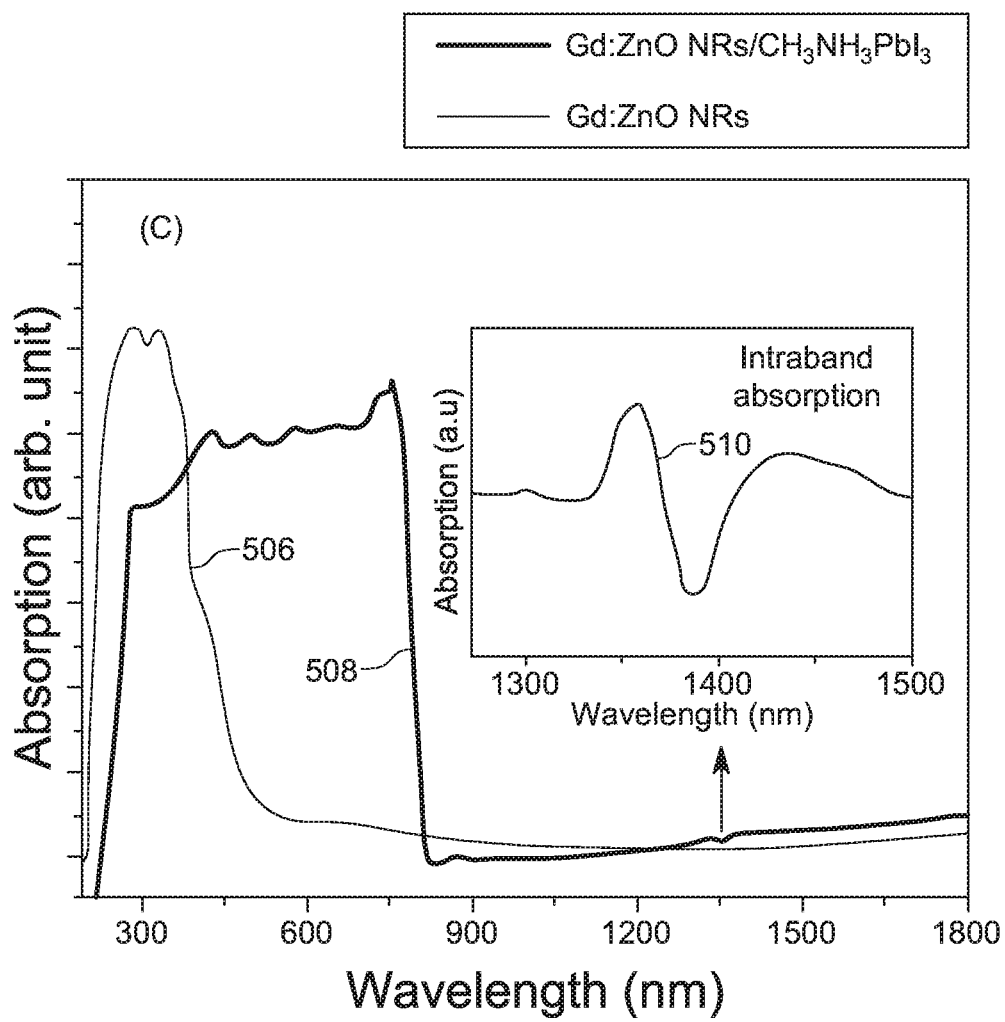

FIGS. 5A, 5B, and 5C illustrate UV-Vis absorption measurements for various components of an example optoelectronic device according to an example embodiment. These UV-Vis absorption measurements provide information to identify the spectral region at which the photodetector device can be functional by estimating the bandgap of the NRs and the perovskite and investigating any other absorption edges arising from characteristics that can affect the device response. As shown in FIG. 5A, curve 502 provides the room-temperature photoluminescence (RT PL) spectra of Gd-doped ZnO NRs. As shown in FIG. 5B, curve 504 provides the RT PL spectra of $CH_3NH_3PbI_3$ perovskite. As shown in FIG. 5C, curve 506 provides the absorption spectra of Gd-doped ZnO NRs and perovskite $CH_3NH_3PbI_3$., and inset curve 510 shows the perovskite intraband transition in the IR region. The PL spectrum of all samples shows that these samples are high quality ZnO NRs/perovskite materials that can be suitable for electronic and optoelectronic application, as no intense deep-level defect bands are observed in the green-red spectral regions. The strong and sharp main band edge emission at room temperature, at λ=376.18 nanometers and 767 nanometers, at 3.26 eV and 1.61 eV, respectively, indicates a high crystalline structure of the ZnO NRs/perovskite.

FIG. 5C further shows optical absorption spectra of the Gd-doped ZnO NRs as well as ZnO NRs/$CH_3NH_3PbI_3$, indicating UV and visible absorption edges corresponding to the ZnO NRs and $CH_3NH_3PbI_3$ bandgaps, respectively, which are in good agreement with conventional values. These absorption edges occurs due to band-to-band transitions in both materials. For comparison, the absorption spectrum of $CH_3NH_3PbI_3$ on glass was obtained. A redshift in the absorption edge (to 820 nm) was observed, indicating that a different stress is applied on the material grown on ZnO NRs. XRD measurements of $CH_3NH_3PbI_3$ perovskite synthesized on a glass substrate confirm this result, revealing a slight shift in the XRD peak arising from the perovskite material grown on glass compared to that of perovskite grown on ZnO. For $CH_3NH_3PbI_3$ absorption spectrum, in the 1350-1410 nm range, a Fano-like intraband transition with the negative portion centered at 1357 nanometers is directly observed, as shown in the inset curve 510 of FIG. 5C. A similar intraband transition is observed in a perovskite material. The intraband transition occurs when the photons may excite electrons into a higher energy level within the same band. However, electrons may only be excited into empty states. Thus, intraband transitions are mainly observed in small bandgap materials and semimetals due to the presence of unfilled electron bands. In addition, the lower wavelength limit is determined by the difference in the conduction band energies of the component semiconductors, while the upper wavelength limit is ultimately imposed by the operating temperature, since the energy level spacing must satisfy the $E2-E1>K_BT$ condition to prevent thermal occupation of the upper level. This demonstrates the advantage of intraband absorption for our device with metal substrate/Gd-doped ZnO NRs/$CH_3NH_3PbI_3$/ITO structure, making it suitable for infrared photodetection.

Figure 6A:
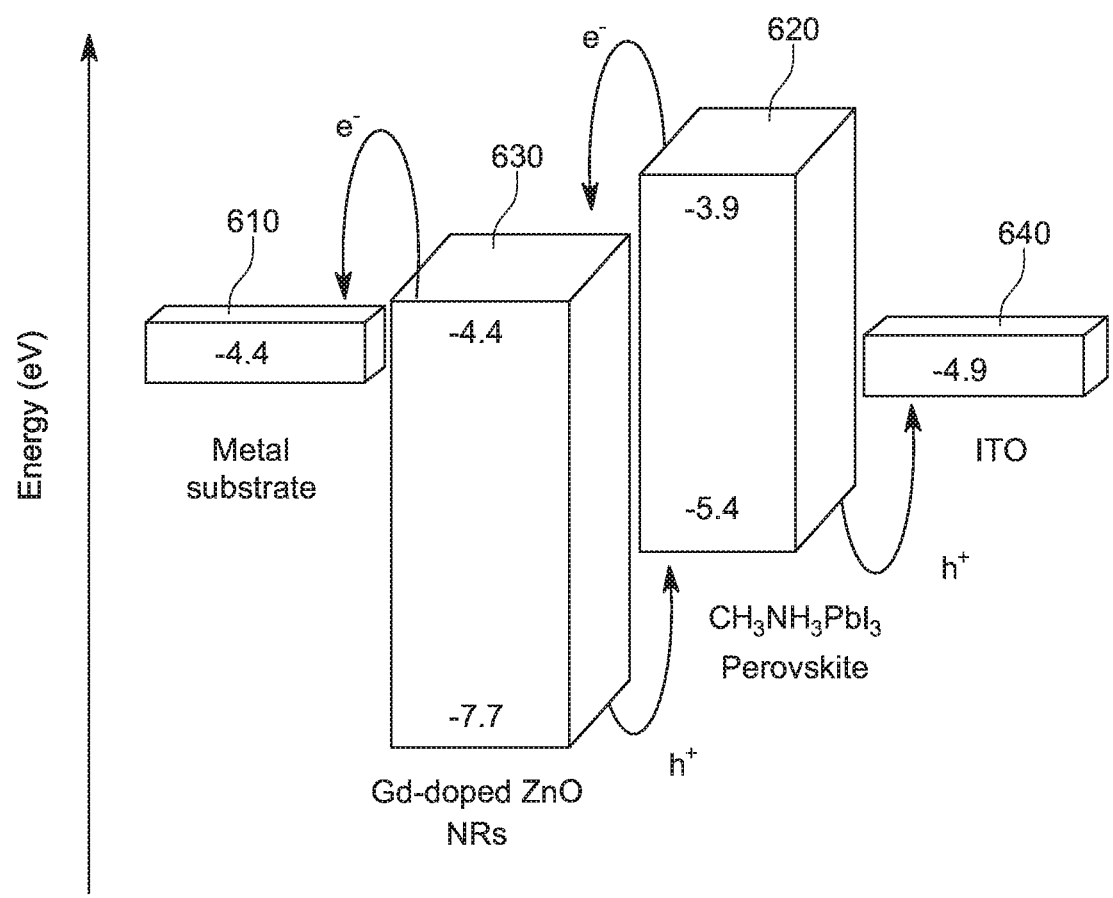
FIGS. 6A and 6B illustrate energy level diagrams for various components of example optoelectronic devices according to example embodiments.
Figure 6B:
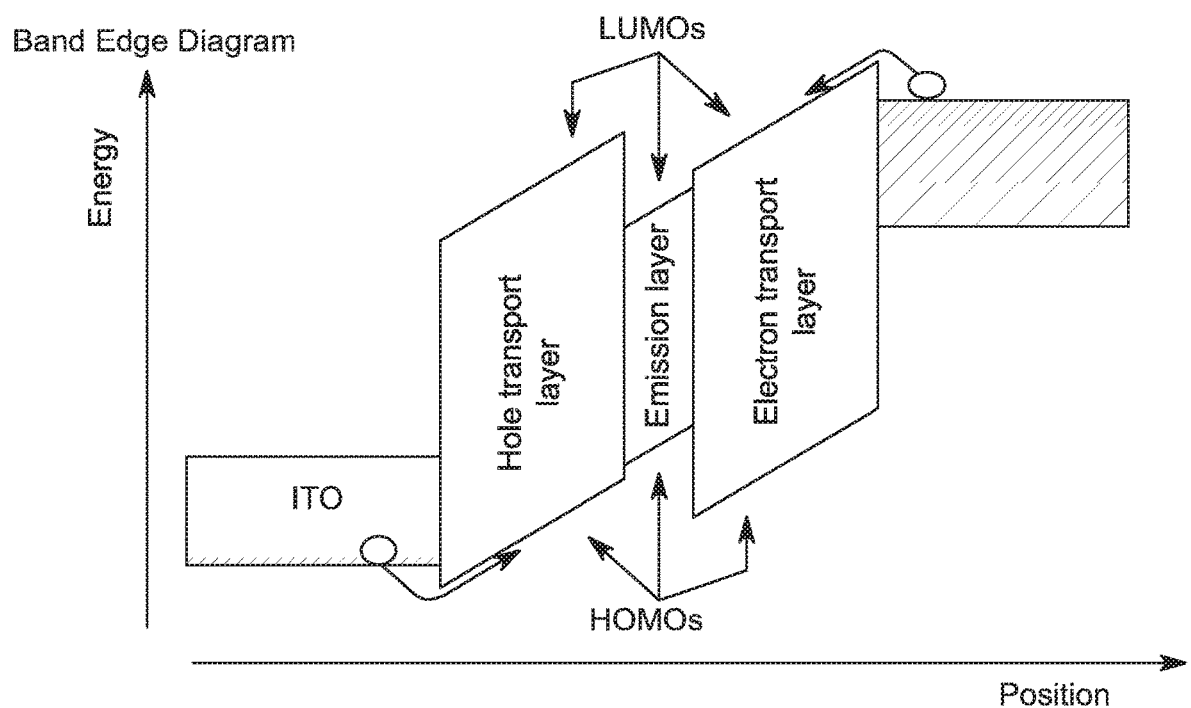

FIGS. 6A and 6B illustrate energy level diagrams for various components of example optoelectronic devices according to example embodiments. FIG. 6A provides an energy level diagram of a photodetector structure comprising a metal substrate 610, Gd-doped ZnO NRs 630, $CH_3NH_3PbI_3$ perovskite layer 620, and ITO layer 640. FIG. 6B provides a diagram of the working mechanism using a band diagram for a conventional light emitting diode (LED) fabricated using soft materials such as perovskite under forward bias (for light emission). The emission is from the back of the device. In some embodiments, an example device fabricated according to the present disclosure may have the same or similar band diagram as the conventional LED shown in FIG. 6B. However, unlike the conventional LED shown in FIG. 6B, the emission will be from the top of the device, not the back. In addition, as described with reference to FIGS. 1, 2A, and 2B, the inexpensive substrate of the device will act as substrate, electron transport layer, and cathode. As further described with reference to FIGS. 1, 2A, and 2B, the injection can be from the top as well as from the bottom of the device. In some embodiments, for the device under forward bias: the hole transport layer (HTL) has a relatively high edge highest occupied molecular orbital (HOMO) energy and transports carbocations relatively easily; a potential barrier between the HTL (or emissive layer) and the ETL blocks further transport of the holes; the ETL has a relatively high lowest unoccupied molecular orbital (LUMO) energy and transports carbanions relatively easily; and emitted light escapes through the indium tin oxide (ITO) anode and the glass.

Figure 7:
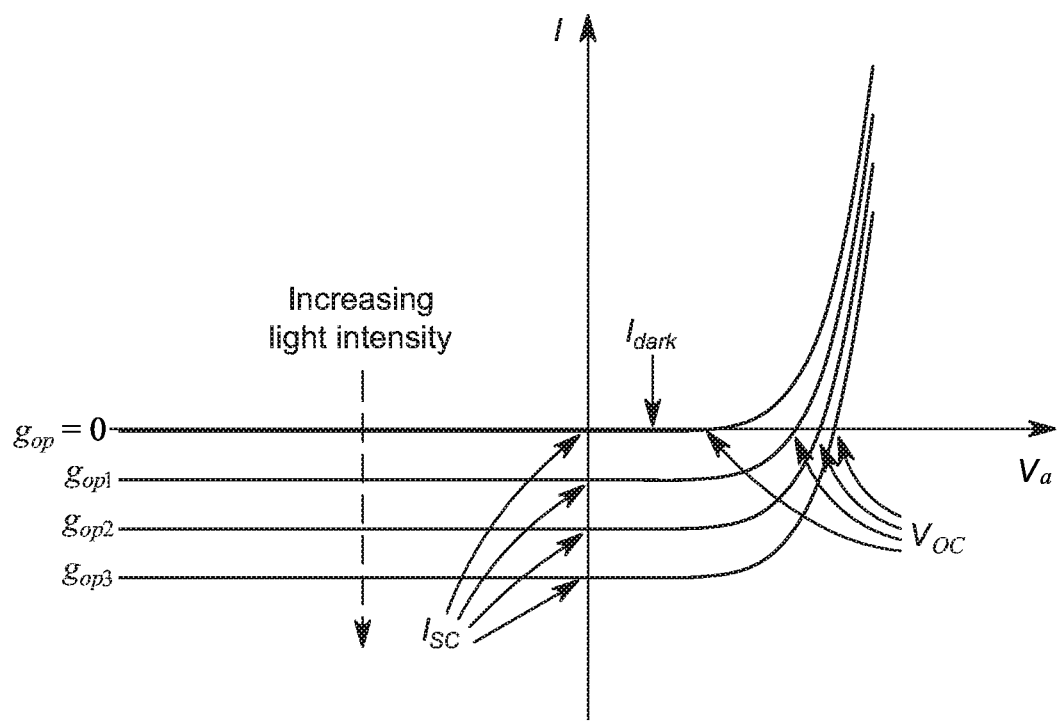
FIG. 7 provides photovoltaic character curves for an example optoelectronic device according to an example embodiment.

FIG. 7 provides photovoltaic character curves for an example optoelectronic device according to an example embodiment. In some embodiments, the photovoltaic effect for solar devices may have the same or similar solar device mechanism. For example, when $v_a=0$ (Short circuit voltage), there is a current $I_{SC}$ from n to p that can be written as $I=I_{SC}=-I_{op}$. When $I=0$ (open circuit current), the voltage can be written as:

$$V = V_{OC} = \frac{\kappa T}{q}\ln\left(\frac{I_{op}}{I_0}+1\right)$$

Absorption of photons across a pn junction generates photovoltaic voltage. This separation of charge creates an electric field at the junction which is in opposition to that already existing at the junction, thereby reducing the net electric field. The total current $I_{total}$ can be written as:

$$I_{total}=I_{dark}-I_{op}=I_0(e^{qV_a/KT}-1)-I_{op}$$

The current I is defined as positive if current (hole) is flowing from p to n (the negative sign in front of $I_{op}$ is showing that photocurrent is from n to p). Therefore, the total current flowing through the p-n junction is reduced by light exposure. The light induces a reverse current. In some instances, a limited voltage may result in $V=V_0$.

In some embodiments, a photodetector will have a similar functionality as a photodetector device. A photodetector converts light power into an electric signal and contains a similar LED structure and the light is illuminated from the top. However, reverse current is applied. Photon generated e-h pairs will be separated according to the band diagram shown in FIG. 6B. However, reverse current is through top and bottom contacts to an external circuit.

Figure 8:
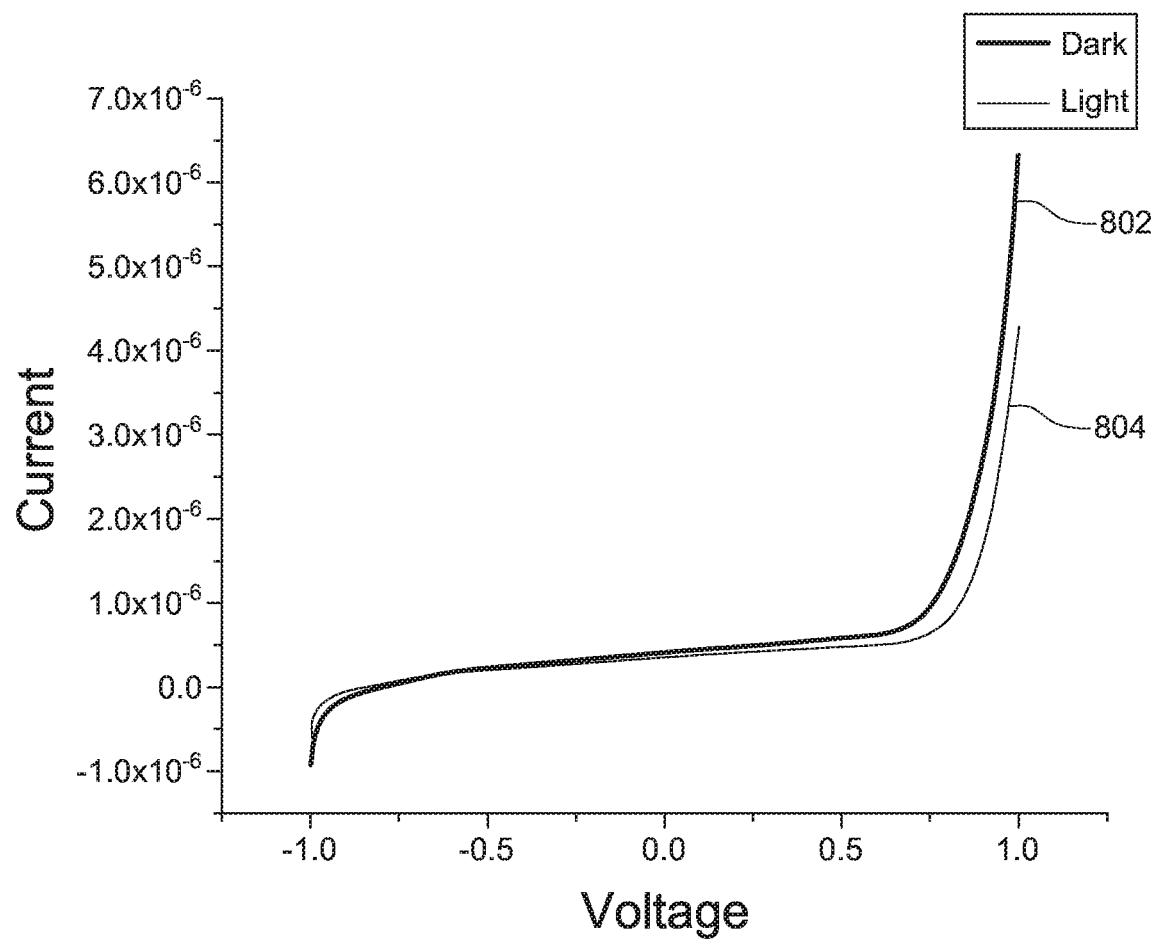
FIG. 8 provides current-voltage (I-V) characteristics for an example optoelectronic device according to an example embodiment.

FIG. 8 provides current-voltage (I-V) characteristics for an example optoelectronic device according to an example embodiment. In some embodiments, the diode behavior of the device can be used as a light emitting diode (LED), a solar cell, or a photovoltaic cell. As shown in FIG. 8, a Gd-doped ZnO, perovskite, ITO, and Au/Ti device (e.g., optoelectronic device 100 described with reference to FIG. 1, optoelectronic device 200 described with reference to FIGS. 2A and 2B) with various lengths of ZnO NRs exhibits rectifying behavior of the diode. Curve 802 ("Dark") and curve 804 ("Light") show the change of the device response with and without light, respectively, confirming its potential for photovoltaic devices or photodetectors. The forward bias behavior indicates that this device can work as an LED.

Figure 9A:
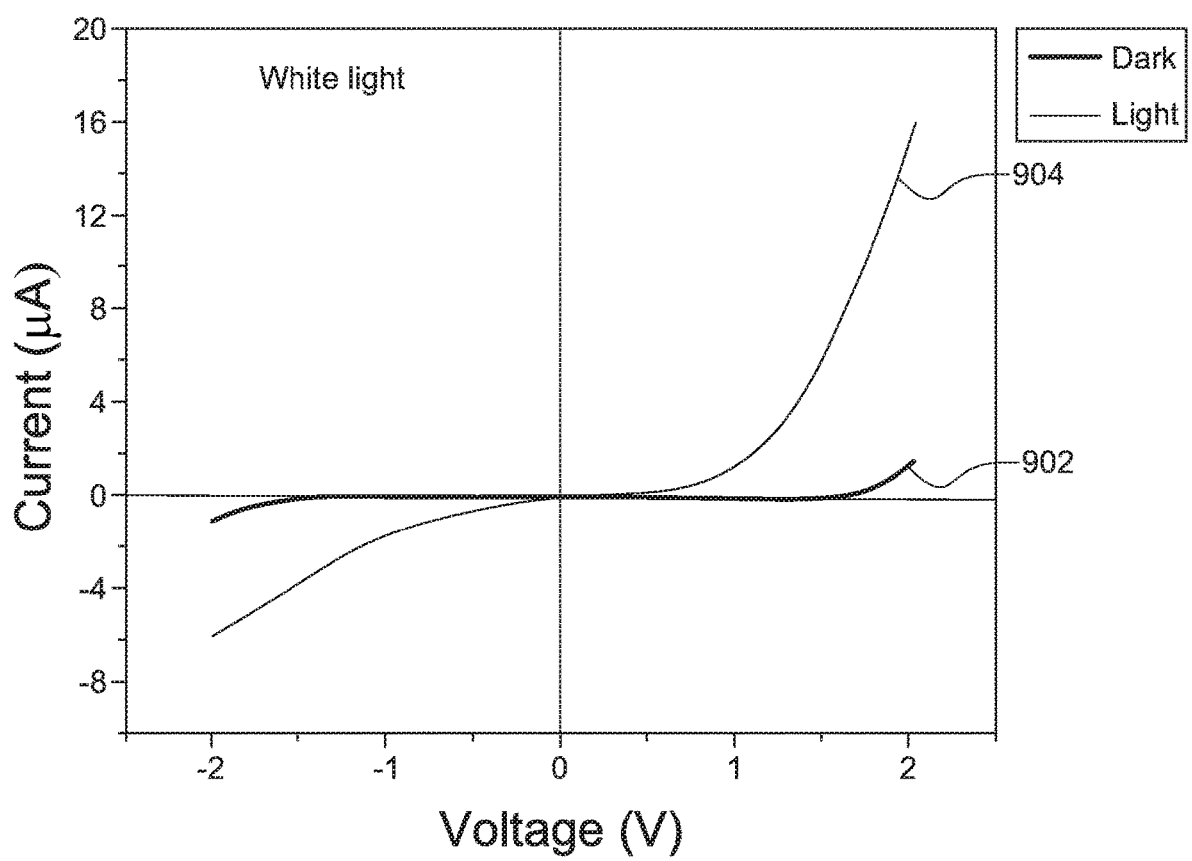
FIGS. 9A, 9B, 9C, 9D, 9E, and 9F provide photoluminescence (PL) measurements for Gd-doped ZnO NRs according to example embodiments.
Figure 9B:
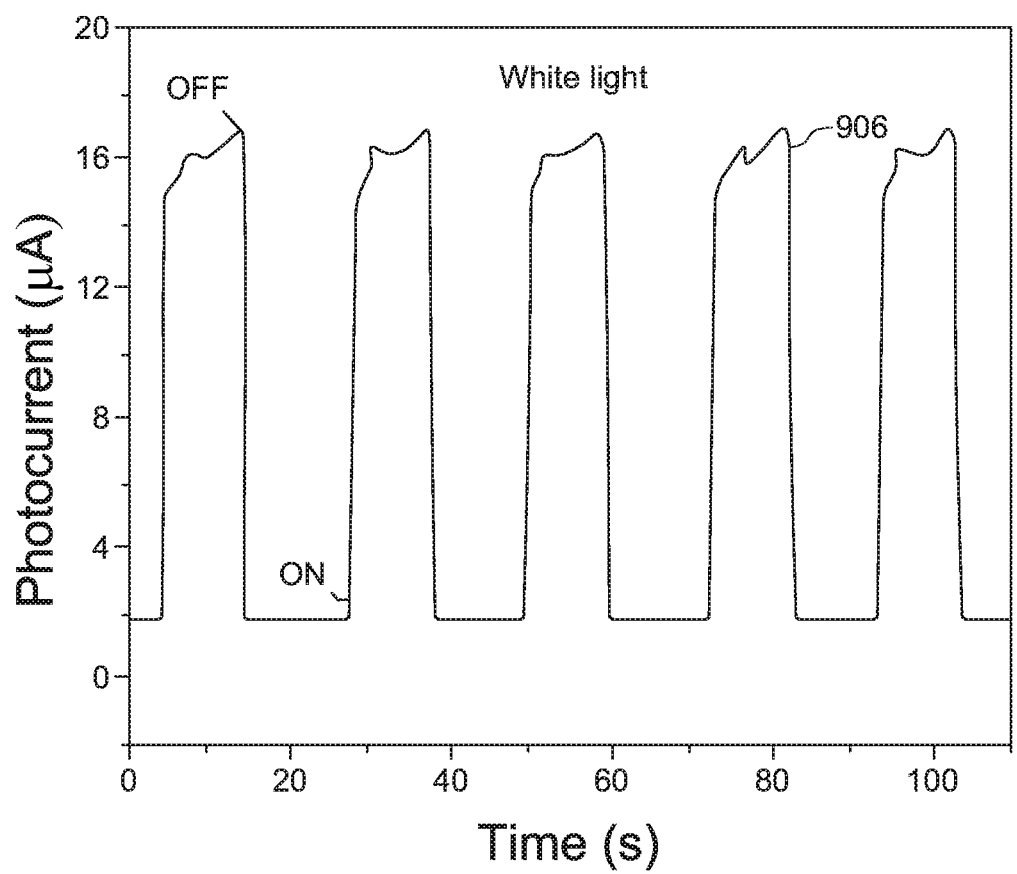
Figure 9C:
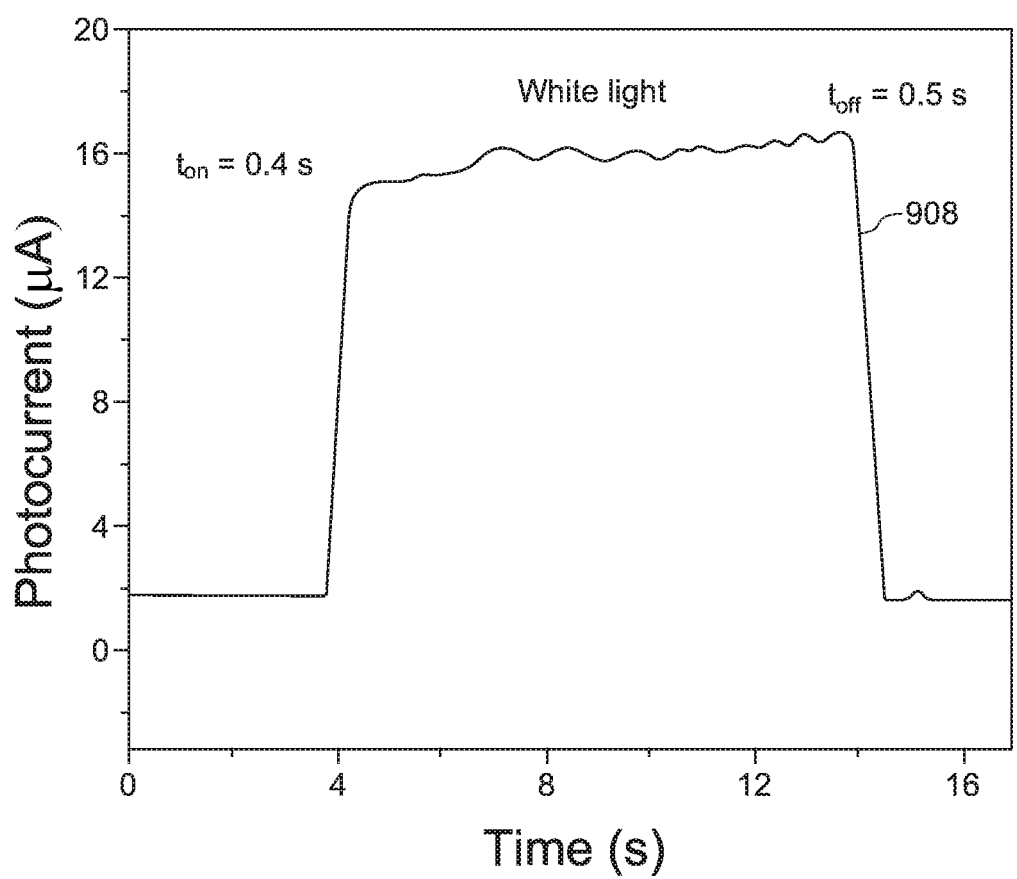

FIGS. 9A, 9B, 9C, 9D, 9E, and 9F provide photoluminescence (PL) measurements for Gd-doped ZnO NRs according to example embodiments. FIGS. 9A, 9B, and 9C provide measurements for photodetection under white illumination. As shown in FIG. 9A, curve 902 ("Dark") and curve 904 ("Light") provide room temperature photocurrent versus voltage plots of the device at a 2 V applied voltage in the dark and under white-light illumination (0.5 mW/cm$^2$). As shown in FIG. 9B, curve 906 provides a conductance photoresponse of the device under white-light illumination measured for light-on and light-off conditions. As shown in FIG. 9C, curve 908 provides a transient response measured for white-light. To study the device response, current-voltage (I-V) measurements were carried out in the dark and under illumination with a 0.5 mW/cm$^2$ light source at an applied bias of 2 V, as shown in FIG. 9A. The dark current was 1.75 and when the device was illuminated, the photocurrent increased to 16.12 demonstrating a nonlinear and asymmetrical I-V behavior. The photodetector performance was evaluated by examining two key factors, namely photo-responsivity (R) and detectivity (D*). Under illumination, the photo-responsivity reached R=28 A/W at 2 V, which is the best responsivity value reported for a ZnO-NRs/CH$_3$NH$_3$PbI$_3$ perovskite photodetector reported for conventional devices. This result confirms that the device structure yields superior photodetector performance compared with conventional photodetector devices based on glass or Si substrates. In addition, detectivity is an important parameter characterizing the normalized signal-to-noise performance of photodetectors. In the present disclosure, the highest detectivity value (D*=1.2×10$^{12}$ Jones) is comparable to state-of-the art perovskite photodetectors. This higher performance can be due to higher photo-generated carrier injection through the metal substrate and Gd-doped ZnO NRs, as Gd dopants were found to increase ZnO mobility by shifting the Fermi level above the conduction band, thus assisting in enhancing the functionality of ZnO NRs as ETL. FIG. 9B shows the photo-current of the devices during repetitive on/off illumination light switching, while the transient photocurrent of this device is shown in more detail in FIG. 9C. In most applications, a fast response and recovery speed are desired photodetector characteristics. Herein, the rising time is defined as the time required to transition from 10 percent to 90 percent of the maximum photocurrent, while recovery time represents the time required for a reduction from 90 percent to 10 percent of the maximum photocurrent. The rise ($t_{rise}$=0.4 s) and fall ($t_{fall}$=0.5 s) response times obtained in the present disclosure are considered a fast response and are comparable to those obtained in conventional devices.

Figure 9D:
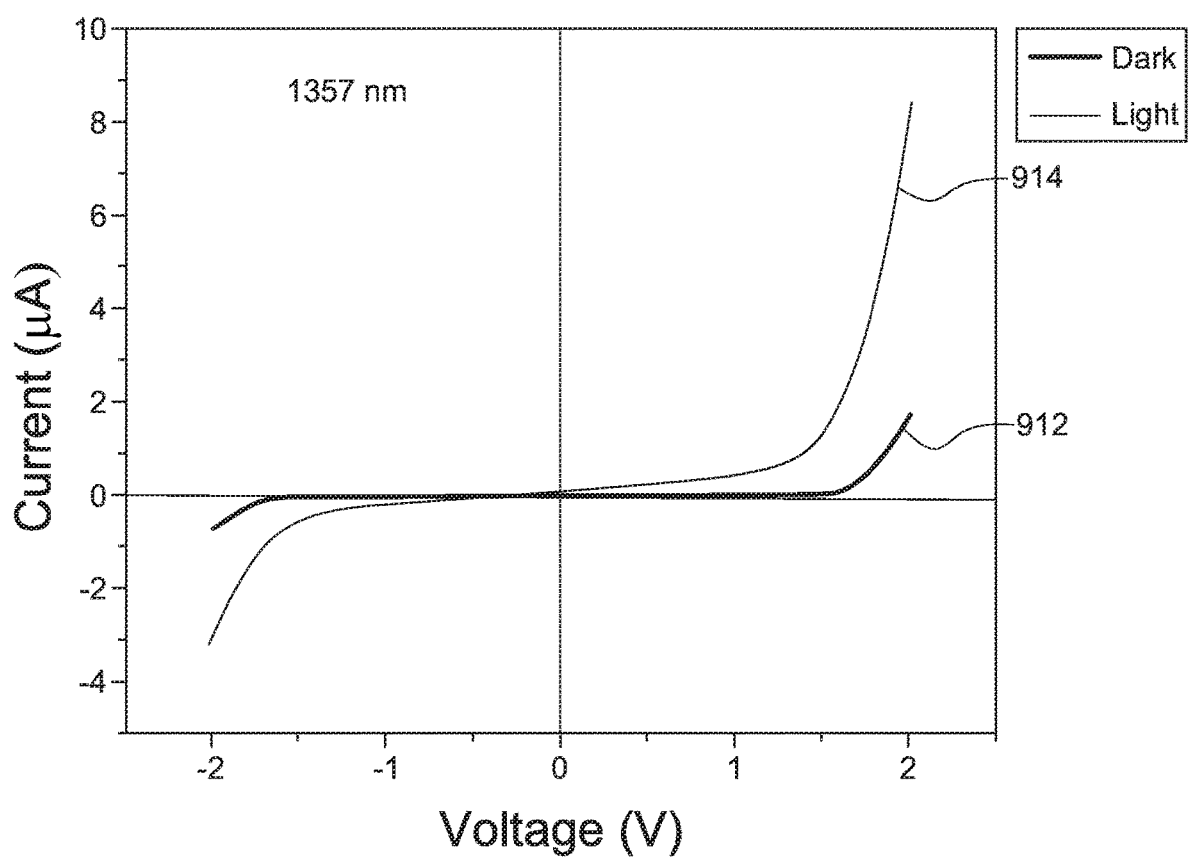
Figure 9E:
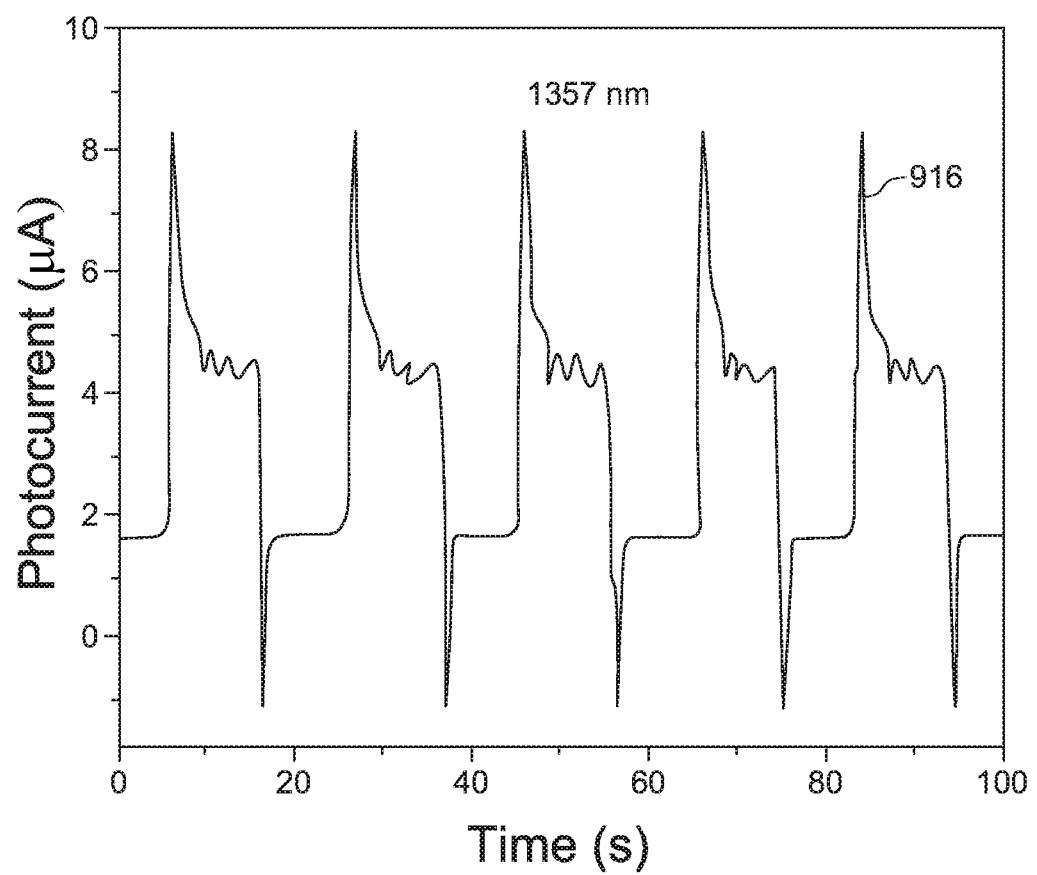
Figure 9F:
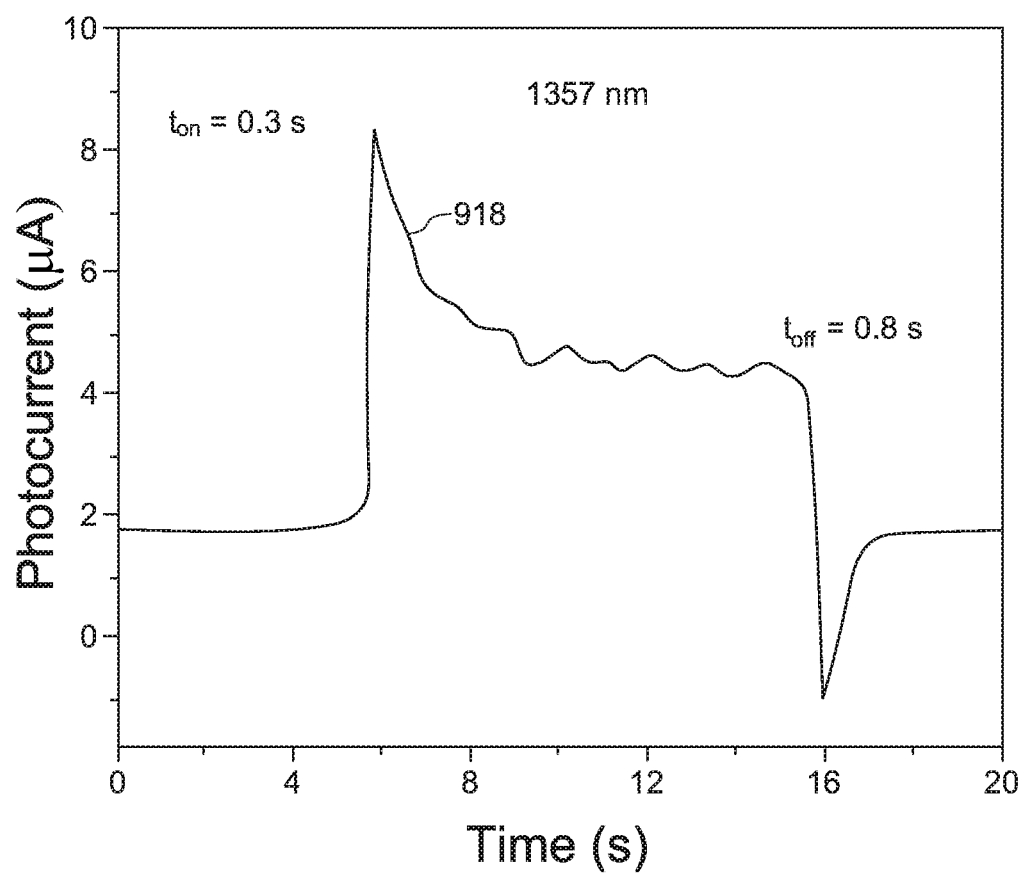

FIGS. 9D, 9E, and 9F provide measurements for photodetection under infra-red (IR) illumination at 1357 nanometers. As shown in FIG. 9D, curve 912 ("Dark") and curve 914 ("Light") provide room temperature photocurrent versus voltage plots of the device at a 2 V applied voltage in the dark and under IR illumination (1357 nanometers) with 30 mW/cm$^2$. As shown in FIG. 9E, curve 916 provides a conductance photoresponse of the device under IR illumination measured for light-on and light-off conditions. As shown in FIG. 9F, curve 918 provides a transient response measured for IR illumination. None of the conventional perovskite-based photodetectors included detection in the IR region due to intraband transitions. The present disclosure shows that perovskite photodetectors can operate in the IR region. To further study the broad spectrum detection properties of our Gd-doped ZnO NRs/CH$_3$NH$_3$PbI$_3$ perovskite-based photodetector in the IR spectral region, the photo-response characteristics were investigated under IR illumination in the 1200-1600 nm range. The maximum IR photo-response at 1357 nm was obtained, as this spectral line is due to intraband absorption (for reference, see the inset curve 510 of FIG. 5C). FIG. 9D shows typical I-V plots obtained by conducting measurements in the dark and under IR illumination (30 mW/cm$^2$). The dark current was 1.75 while 8.46 μA photocurrent was obtained when the device was illuminated. This value is low compared to that obtained under white light illumination due to fewer intraband photogenerated carriers compared to band-to-band transitions (which occur as a result of UV-visible illumination). The current responses of the device to a typical on/off IR illumination cycle are presented in FIG. 9E. In the IR region, the device still exhibited high photo-responsivity and high detectivity (R=0.22 A/W, D=9.3×10$^9$ Jones) at room temperature that are comparable to room temperature values of conventional IR photodetectors. In addition, both values exceed those obtained under white light illumination in conventional studies, confirming superior photo-responsivity and detectivity of the device. From FIG. 9F, the rise ($t_{rise}$=0.2 s) and fall ($t_{fall}$=0.8 s) response times can be discerned, respectively, for IR detection. Thus, the present disclosure has demonstrated that Gd-doped ZnO NRs/CH$_3$NH$_3$PbI$_3$ perovskite can work as a broadband (from UV to IR) photodetector with high photo-responsivity. The inventors have found that the NRs/CH$_3$NH$_3$PbI$_3$ device on a metal substrate can also work as an X-ray radiation detector.

Figure 10:
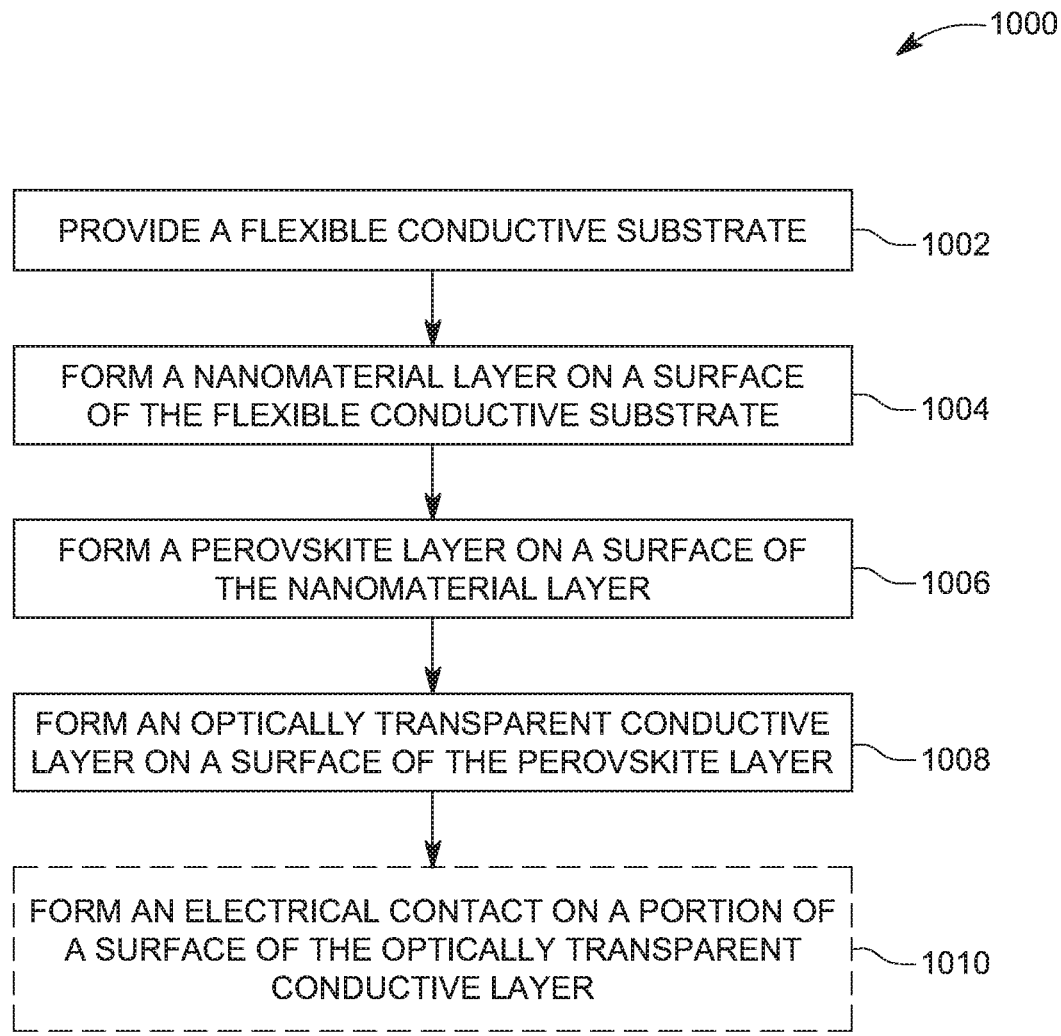
FIG. 10 illustrates an example method of manufacturing an apparatus according to an example embodiment.

FIG. 10 illustrates an example method 1000 of manufacturing an apparatus according to an example embodiment. The manufactured apparatus may be an optoelectronic device, such as optoelectronic device 100 described with reference to FIG. 1, optoelectronic device 200 described with reference to FIGS. 2A and 2B, any other suitable device, or any suitable portion or combination thereof. The device may also be an X-ray radiation detector.

At step 1002, the method may include providing a flexible conductive substrate. The flexible conductive substrate may be any suitable flexible conductive substrate described herein, such as flexible conductive substrate 110 described with reference to FIG. 1, flexible conductive substrate 210 described with reference to FIGS. 2A and 2B, or flexible conductive substrate 310 described with reference to FIG. 3C. For example, the flexible conductive sheet may be a metal sheet, such as an Al sheet or a 316L stainless steel sheet. The flexible conductive substrate may be provided according to any suitable process or technique, such as any process or technique described with reference to any of FIGS. 1-10, or any combination thereof.

At step 1004, the method may further include forming a nanomaterial layer on a surface of the flexible conductive substrate. The nanomaterial layer may be any suitable nanomaterial layer described herein, such as nanomaterial layer 130 described with reference to FIG. 1, nanomaterial layer 230 described with reference to FIGS. 2A and 2B, or nanomaterial layer 330 described with reference to FIGS. 3A, 3B, and 3C. For example, the nanomaterial layer may comprise one or more semiconductor or oxide nanorods or nanowires, including, but not limited to, one or more rare earth doped zinc oxide nanorods, such as Gd-doped ZnO NRs. The nanomaterial layer may be formed on the surface of the flexible conductive substrate according to any suitable process or technique, such as any growth or deposition process or technique described with reference to any of FIGS. 1-10, or any combination thereof. For example, forming the nanomaterial layer may comprise forming the nanomaterial layer on the surface of the flexible conductive substrate by pulsed laser deposition, magnetron sputtering, chemical vapor deposition, metal-organic chemical vapor deposition, plasma-enhanced chemical vapor deposition, electrodeposition, or molecular beam epitaxy. In another example, forming the nanomaterial layer may comprise growing the nanomaterial layer on the surface of the flexible conductive substrate. In another example, forming the nanomaterial layer may comprise growing the nanomaterial layer on the surface of the flexible conductive substrate without using a seed layer or a conductive oxide layer. In another example, forming the nanomaterial layer may comprise forming a nanomaterial layer comprising one or more semiconductor or oxide nanorods or nanowires on the surface of the flexible conductive substrate. In another example, forming the nanomaterial layer may comprise forming a nanomaterial layer comprising one or more zinc oxide nanorods on the surface of the flexible conductive substrate. In another example, forming the nanomaterial layer may comprise forming a nanomaterial layer comprising one or more rare earth doped zinc oxide nanorods on the surface of the flexible conductive substrate. In another example, forming the nanomaterial layer may comprise forming a nanomaterial layer comprising one or more gadolinium doped zinc oxide nanorods on the surface of the flexible conductive substrate.

At step 1006, the method may further include forming a perovskite layer on a surface of the nanomaterial layer. The perovskite layer may be any suitable perovskite layer described herein, such as perovskite layer 120 described with reference to FIG. 1, perovskite layer 220 described with reference to FIGS. 2A and 2B, or perovskite layer 320 described with reference to FIGS. 3B and 3C. The perovskite layer may be formed on the surface of the nanomaterial layer according to any suitable process or technique, such as any growth or deposition process or technique described with reference to any of FIGS. 1-10, or any combination thereof.

At step 1008, the method may further include forming an optically transparent conductive layer on a surface of the perovskite layer. The optically transparent conductive layer may be any suitable optically transparent conductive layer described herein, such as optically transparent conductive layer 140 described with reference to FIG. 1, optically transparent conductive layer 240 described with reference to FIGS. 2A and 2B, or optically transparent conductive layer 340 described with reference to FIG. 3C. The optically transparent conductive layer may be formed on the surface of the perovskite layer according to any suitable process or technique, such as any growth or deposition process or technique described with reference to any of FIGS. 1-10, or any combination thereof.

At optional step 1010, the method may optionally include forming an electrical contact on a portion of a surface of the optically transparent conductive layer. The electrical contact may be any suitable electrical contact described herein, such as any electrical contact described with reference to FIG. 1 or optional electrical contact 250 described with reference to FIGS. 2A and 2B. The electrical contact may be formed on the portion of the surface of the optically transparent conductive layer according to any suitable process or technique, such as any growth or deposition process or technique described with reference to any of FIGS. 1-10, or any combination thereof.

In some embodiments, the method 1000 may comprise providing the flexible conductive substrate at step 1002 before forming the nanomaterial layer at step 1004. In some embodiments, the method 1000 may comprise forming the nanomaterial layer at step 1004 before forming the perovskite layer at step 1006. In some embodiments, the method 1000 may comprise forming the perovskite layer at step 1006 before forming the optically transparent conductive layer at step 1008. In some embodiments, the method 1000 may optionally comprise forming the optically transparent conductive layer at 1008 before forming the electrical contact at step 1010. In some embodiments, the steps 1002, 1004, 1006, and 1008, and optional step 1010, may not necessarily occur in the order depicted in FIG. 10, and in some cases one or more of the steps depicted in FIG. 10 may occur substantially simultaneously, or additional steps may be involved before, after, or between any of the steps shown in FIG. 10.

While various embodiments in accordance with the principles disclosed herein have been shown and described above, modifications thereof may be made by one skilled in the art without departing from the teachings of the disclosure. The embodiments described herein are representative only and are not intended to be limiting. Many variations, combinations, and modifications are possible and are within the scope of the disclosure. Alternative embodiments that result from combining, integrating, and/or omitting features of the embodiment(s) are also within the scope of the disclosure. Accordingly, the scope of protection is not limited by the description set out above, but is defined by the claims which follow, that scope including all equivalents of the subject matter of the claims. Each and every claim is incorporated as further disclosure into the specification and the claims are embodiment(s) of the present disclosure. Furthermore, any advantages and features described above may relate to specific embodiments, but shall not limit the application of such issued claims to processes and structures accomplishing any or all of the above advantages or having any or all of the above features.

In addition, the section headings used herein are provided for consistency with the suggestions under 37 C.F.R. 1.77 or to otherwise provide organizational cues. These headings shall not limit or characterize the disclosure set out in any claims that may issue from this disclosure. For instance, a description of a technology in the "Background" is not to be construed as an admission that certain technology is prior art to any disclosure in this disclosure. Neither is the "Summary" to be considered as a limiting characterization of the disclosure set forth in issued claims. Furthermore, any reference in this disclosure to "disclosure" or "embodiment" in the singular should not be used to argue that there is only a single point of novelty in this disclosure. Multiple embodiments of the present disclosure may be set forth according to the limitations of the multiple claims issuing from this disclosure, and such claims accordingly define the disclosure, and their equivalents, that are protected thereby. In all instances, the scope of the claims shall be considered on their own merits in light of this disclosure, but should not be constrained by the headings set forth herein.

Also, techniques, systems, subsystems, and methods described and illustrated in the various embodiments as discrete or separate may be combined or integrated with other systems, modules, techniques, or methods without departing from the scope of the present disclosure. Other items or layers shown or discussed as disposed on, or forming an interface with, each other may be indirectly coupled through some intermediate interface, layer, device, or component, whether electrically, mechanically, or otherwise. Other examples of changes, substitutions, and alterations are ascertainable by one skilled in the art and could be made without departing from the scope disclosed herein.

Many modifications and other embodiments of the disclosure set forth herein will come to mind to one skilled in the art to which these embodiments pertain having the benefit of teachings presented in the foregoing descriptions and the associated figures. Although the figures only show certain components of the apparatus and systems described herein, it is understood that various other components may be used in conjunction with the supply management system. Therefore, it is to be understood that the disclosure is not to be limited to the specific embodiments disclosed and that modifications and other embodiments are intended to be included within the scope of the appended claims. For example, the various elements, components, or layers may be combined, rearranged, or integrated in another system or certain features may be omitted or not implemented. Moreover, the steps in any method described above may not necessarily occur in the order depicted in the accompanying figures, and in some cases one or more of the steps depicted may occur substantially simultaneously, or additional steps may be involved. Although specific terms are employed herein, they are used in a generic and descriptive sense only and not for purposes of limitation.

The invention claimed is:

1. An apparatus comprising:
a flexible conductive substrate comprising a first surface;
a perovskite layer comprising a second surface and a third surface disposed opposite the second surface, wherein the second surface is located directly on the first surface of the flexible conductive substrate;
a nanomaterial layer disposed on the first surface of the flexible conductive substrate, wherein the nanomaterial layer is further disposed directly on the first surface of the flexible conductive substrate and includes nanorods that extends within a portion of the perovskite layer so that a first end of the nanorods is in direct contact with the first surface of the flexible conductive substrate and a second end is in direct contact with the portion of the perovskite layer; and
an optically transparent conductive layer comprising a fourth surface disposed on the third surface of the perovskite layer.

2. The apparatus of claim 1, wherein the perovskite layer comprises an inorganic perovskite material.

3. The apparatus of claim 1, wherein each of the nanorods of the nanomaterial layer has a diameter of at least 50 nm.

4. The apparatus of claim 1, wherein the nanomaterial layer comprises graphene.

5. The apparatus of claim 1, wherein the nanomaterial layer comprises one or more nanomaterials formed on the first surface of the flexible conductive substrate by pulsed laser deposition, by magnetron sputtering, by chemical vapor deposition, by metal-organic chemical vapor deposition, by plasma-enhanced chemical vapor deposition, by electrodeposition, or by molecular beam epitaxy.

6. The apparatus of claim 1, wherein the nanomaterial layer comprises one or more nanomaterials grown on the first surface of the flexible conductive substrate without using a seed layer.

7. The apparatus of claim 1, wherein the optically transparent conductive layer comprises one or more nanowires, wherein the one or more nanowires comprise one or more silver nanowires.

8. The apparatus of claim 1, wherein the optically transparent conductive layer comprises a metal mesh or graphene.

9. The apparatus of claim 1, wherein the nanomaterial layer comprises one or more rare earth doped zinc oxide nanorods.

10. The apparatus of claim 1, wherein the nanomaterial layer comprises one or more gadolinium doped zinc oxide nanorods.

11. The apparatus of claim 1, wherein the optically transparent conductive layer further comprises a fifth surface disposed opposite the fourth surface, the apparatus further comprising:
an electrical contact comprising a sixth surface, wherein the sixth surface of the electrical contact is disposed on a portion of the fifth surface of the optically transparent conductive layer.

12. The apparatus of claim 1, wherein a first portion of the nanomaterial layer extends into a second portion of the perovskite layer.

13. A method of manufacturing an apparatus, the method comprising:
providing a flexible conductive substrate;
forming a nanomaterial layer directly on a surface of the flexible conductive substrate;
forming a perovskite layer on a surface of the nanomaterial layer so that the nanomaterial layer extends within a portion of the perovskite layer, wherein a part of the perovskite layer is in direct contact with the flexible conductive substrate; and
forming an optically transparent conductive layer on a surface of the perovskite layer,
wherein the nanomaterial layer includes nanorods that have a first end in direct contact with the flexible conductive substrate and a second within the portion of the perovskite layer.

14. The method of claim 13, wherein the perovskite layer comprises an inorganic perovskite material.

15. The method of claim 13, wherein each of the nanorods of the nanomaterial layer has a diameter of at least 50 nm.

16. The method of claim 13, wherein the nanomaterial layer comprises graphene, one or more rare earth doped zinc oxide nanorods, one or more gadolinium doped zinc oxide nanorods, one or more nanomaterials formed on the first surface of the flexible conductive substrate.

17. The method of claim 13, wherein forming the nanomaterial layer comprises forming the nanomaterial layer on the surface of the flexible conductive substrate by pulsed laser deposition, by magnetron sputtering, by chemical vapor deposition, by metal-organic chemical vapor deposition, by plasma-enhanced chemical vapor deposition, by electrodeposition, or by molecular beam epitaxy.

18. The method of claim 13, wherein forming the nanomaterial layer comprises growing the nanomaterial layer on the surface of the flexible conductive substrate.

19. The method of claim 13, wherein forming the nanomaterial layer comprises growing the nanomaterial layer on the surface of the flexible conductive substrate without using a seed layer or without using a conductive oxide layer.

20. The method of claim 13, wherein the method comprises:
forming an electrical contact on a portion of a surface of the optically transparent conductive layer.

* * * * *